United States Patent
Masuda et al.

(10) Patent No.: US 7,843,287 B2
(45) Date of Patent: Nov. 30, 2010

(54) ACTIVE RESONANT CIRCUIT WITH RESONANT-FREQUENCY TUNABILITY

(75) Inventors: Toru Masuda, Kokubunji (JP); Hiroshi Mori, Takasaki (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 36 days.

(21) Appl. No.: 12/127,782

(22) Filed: May 27, 2008

(65) Prior Publication Data

US 2009/0033440 A1 Feb. 5, 2009

(30) Foreign Application Priority Data

Jul. 30, 2007 (JP) ............................. 2007-197631

(51) Int. Cl.
*H03H 11/08* (2006.01)
*H03H 11/00* (2006.01)

(52) U.S. Cl. ...................................... 333/215; 333/213

(58) Field of Classification Search ................ 333/213, 333/214, 215, 216, 217, 252, 254; 331/135
See application file for complete search history.

(56) References Cited

U.S. PATENT DOCUMENTS 6,825,722 B2 * 11/2004 Segawa ....................... 330/254
7,149,191 B2 * 12/2006 Johansson-Gardenfors et al. ................................. 370/280

OTHER PUBLICATIONS

J. Lee et al., "A 7-Band 3-8GHz Frequency Synthesizer with 1ns Band-Switching Time in 0.18μm CMOS Technology," 2005 IEEE International Solid-State Circuits Conference Digest of Technical Papers, pp. 204-205 and 593.
A. Abidi, "Noise in Active Resonators and the Available Dynamic Range," IEEE Transactions on Circuits and Systems—I: Fundamental Theory and Applications, vol. 39, No. 4, Apr. 1992, pp. 296-299.
A. Thanachayanont, "Low Voltage Low Power CMOS Inductorless RF Bandpass Filter with High Image Rejection Capability," IEEE, The 2002 45$^{th}$ Midwest Symposium on Circuits and Systems, vol. 3, pp. III-548 to III-551.
Y. Shin, "An Inductorless 900MHz RF Low-Noise Amplifier in 0.9 μm CMOS," IEEE 1997 Custom Integrated Circuits Conference, pp. 513-516.

* cited by examiner

*Primary Examiner*—Dean O Takaoka
(74) *Attorney, Agent, or Firm*—Miles & Stockbridge P.C.

(57) ABSTRACT

The present invention is directed to provide a low-power-consumption wide-range RF signal processing unit having a small chip occupation area. A semiconductor integrated circuit has, on a semiconductor chip, a resonant circuit including a first capacitor having a capacitance which can be controlled by a first control signal of a first control terminal, and a gyrator for equivalently emulating an inductor by including a second capacitor having a capacitance which can be controlled by a second control signal of a second control terminal. The capacitance and the inductor form a parallel resonant circuit. At the time of changing parallel resonant frequency, the capacitances of the first and second capacitors are coordinately changed. The parallel resonant circuit is suitable for an active load which is connected to an output node of an amplifier.

15 Claims, 14 Drawing Sheets

$$L = \frac{C_L}{gm1\,gm2}$$

ACTIVE RESONANT CIRCUIT WITH RESONANT-FREQUENCY TUNABILITY

CLAIM OF PRIORITY

The present application claims priority from Japanese application JP 2007-197631 filed on Jul. 30, 2007, the content of which is hereby incorporated by reference into this application.

FIELD OF THE INVENTION

The present invention relates to a wireless communication circuit as a component of a wireless communication system and, more particularly, to a technique effectively applied to a method of transmitting/receiving data using a wide multiband.

BACKGROUND OF THE INVENTION

Generally, a wireless communication system uses a predetermined RF band for transmitting/receiving data. For example, in IEEE802.11g known as an American standard of a local area network (LAN), the RF band of 2.4 GHz to 2.47 GHz is used and 54 Mbps is achieved as the maximum data rate in the range of the communication distance of 50 m to 100 m.

However, demands for data of general users are increasing year by year. It is strongly desired to download not only high definition image data but also music data and movie data to portable equipment of the user in short time.

One of techniques addressing the demand is ultra wide band (UWB) wireless communication. Since Federal Communications Commission has permitted commercial use of UWB in April 2002, many organizations have been conducting research and development on the technique. The technique employs a multiband configuration that the frequency range used for the UWB wireless communication is divided into a plurality of frequency bands. In the case of transmitting/receiving data using the multiband, in a frequency band of a signal obtained by modulating/demodulating data, it is necessary to transmit the signal without attenuation as much as possible or necessary to amplify the signal. In the frequency band in which data is not transmitted, it is necessary to attenuate an unwanted signal existing in the band in order to prevent cross modulation.

According to non-patent document 1, a frequency synthesizer for a multiband (MB) OFDM (Orthogonal Frequency Division Multiplexing) system needs band-switching time in the order of nanoseconds and has a difficult challenge on unwanted sideband spectrum and power consumption. Typically, a general PLL-based frequency synthesizer is not simply suitable due to its long settling time of microseconds. The non-patent document 1 describes a high-speed-hopping frequency synthesizer for generating clocks in seven bands distributing from 3 GHz to 8 GHz in switching time of 1 nanosecond. The frequency synthesizer is comprised of two PLL (Phase Locked Loop) circuits, two selectors, and one SSB (Single Side Band) mixer.

Non-patent document 2 describes a gyrator. The gyrator has two transconductance circuits gm1 and gm2 whose input and output terminals are connected in a closed loop configuration, a capacitor C1 connected to the output terminal of the transconductance circuit gm1 and the input terminal of the transconductance circuit gm2, and a capacitor C2 and a resistor R connected to the output terminal of the transconductance circuit gm2 and the input terminal of the transconductance circuit gm1. The gyrator makes the capacitor C2 behave as an inductor L of C2/(gm1·gm2). As described above, the gyrator sets the input impedance as the inverse number of the impedance connected to the output, and can transform a capacitor equivalently to an inductor. Therefore, when a circuit is configured like an LC circuit by using the equivalently transformed inductor, a filter and a resonant circuit can be formed without using an inductor which is difficult to be integrated.

Non-patent document 3 describes a biquad bandpass filter similar to the gyrator described in the non-patent document 2. The non-patent document 3 describes a CMOS full-differential biquad lattice bandpass filter capable of tuning performance index Q and center frequency of the filter with bias voltage and bias current. By adjusting the bias current to 380 $\mu$A to 800 $\mu$A, the center frequency can be tuned to 2.45 GHz to 2.85 GHz by constant gain and bandwidth.

Non-patent document 4 describes a technique of using a combination of a gyrator and a capacitor for emulating the inductor for an RF low-noise amplifier of 900 MHz frequency band in order to avoid using an external inductor and on-chip spiral inductor which are expensive. The gyrator is comprised of two transconductance circuits (gm1 and gm2) which are connected in a negative feedback form. A first capacitance (C1) as a capacitive load configured by a device parasitic capacitor between the circuits generates an input inductance impedance L. The first capacitance (C1) and a second capacitance (C2) on the input side form an LC tank circuit. The LC tank circuit operates as a load on the input-side transconductance circuit. The center frequency of the LC tank circuit is given by $\frac{1}{2}\pi(C1C2/gm1gm2)^{1/2}$.

In the RF low noise amplifier, a differential RF signal is supplied to the source of each of a pair of grounded-gate NMOS transistors as the input-side transconductance circuit. To the drains of the pair of grounded-gate NMOS transistors, the gates of a differential pair of NMOS transistors as the transconductance circuit in the first stage of the gyrator are connected. To the drains of the differential pair of NMOS transistors, a pair of PMOS current-mirror-type loads are connected, and the gates of a pair of PMOS transistors as the transconductance circuit in the second stage of the gyrator are also connected. By connecting the gates of the differential pair of NMOS transistors as the transconductance circuit of the first stage of the gyrator to the drains of the pair of PMOS transistors as the transconductance circuit of the second stage of the gyrator, negative feedback is realized.

The frequency characteristics of the CMOS low-noise amplifier configured as described above are also measured. It is also reported that the amplifier has a gain of about 20 dB around the center frequency of 0.9 GHz and also a gain of about 10 dB around a lower frequency of 0.4 GHz and a higher frequency of 1.4 GHz.

[Non-patent document 1] Jri Lee et al, "A 7-Band 3-8 GHz Frequency Synthesizer with 1 ns Band-Switching Time in 0.18 $\mu$m CMOS Technology", IEEE Solid-State Circuits Conference DIGEST OF TECHNICAL PAPERS, pp. 204 to 205

[Non-patent document 2] A. A. Abidi, "Noise in Active Resonators and the Available Dynamic Range", IEEE TRANSACTIONS ON CIRCUITS AND SYSTEMS-I: FUNDAMENTAL THEORY AND APPLICATIONS, VOL. 39, NO. 4, APRIL 1992, pp. 296 to 299

[Non-patent document 3] Apinunt Thanachayanont, "LOW VOLTAGE LOW POWER CMOS INDUCTORLESS RF BANDPASS FILTER WITH HIGH IMAGE REJECTION CAPABILITY", The 2002 45$^{th}$ Midwest Symposium on Circuits and Systems, Volume 3, pp III-548 to 551

[Non-patent document 4] Young J. Shin et al, "An Inductorless 900 MHz, RF Low-Noise Amplifier in 0.9 μm CMOS", IEEE 1997 CUSTOM INTEGRATED CIRCUITS CONFERENCE, PP. 513 to 516

SUMMARY OF THE INVENTION

In recent years, frequency arrangement for the UWB wireless communication employing the multi-band OFDM (MB-OFDM) system for indoor communications is being proposed. FIG. 2 is a diagram showing the frequency arrangement for the UWB wireless communication employing the MB-OFDM system. As obvious from FIG. 2, the UWB frequency is divided into fifteen sub-bands from the first sub-band having a bandwidth of 528 MHz using 3,432 MHz as a center frequency to the fourteenth sub-band having the same bandwidth of 528 MHz using 10,296 MHz as a center frequency. The 15 sub-bands are grouped every three sub-bands and divided into five groups; a group of the first to third sub-bands, a group of the fourth to sixth sub-bands, a group of the seventh to ninth sub-bands, a group of tenth to twelfth sub-bands, and a group of thirteenth and fourteenth sub-bands. The center frequencies of the sub-bands are 3,432, 3,960, 4,488, 5,016, 5,544, 6,072, 6,600, 7,128, 7,656, 8,184, 8,712, 9,240, 9,768, and 10,296 (unit: MHz) in order from low frequency. A communication network called a pico-net can be formed in each group. At present, wireless communication in which a pico-net is formed by using the sub-bands of the first group of the low frequency is being developed.

However, to provide wireless communication for high-speed data transmission to a number of users, by widely using sub-bands provided for the UWB from about 3 GHz to about 10 GHz, the number of pico-nets has to be increased. Consequently, in a radio circuit for transmitting/receiving a UWB signal, for demodulation of a reception signal and modulation of a transmission signal, it is necessary to generate local signals having the center frequencies of the first to fourteenth sub-bands. The carrier frequencies of the local signals generated by the radio circuit of the MB-OFDM system have to be hopped among the sub-band center frequencies in short time. The maximum time permitted for the carrier frequency switching is specified as 9.5 ns. Hitherto, a phase locked loop (PLL) is used for the switching of the frequencies of the local signals. However, since the PLL is realized by forming a negative feedback loop, there is a drawback that the time required to switch the frequencies of local signals is long, and it takes a few ms.

In a circuit for generating a local signal for the UWB wireless communication, as described in the non-patent document 1, two group frequency signals of 3,432 MHz and 6,864 MHz are generated by a group PLL, and two band frequency signals of 1,056 MHz and 211 MHz are generated by a band PLL. The two group frequency signals of 3,432 MHz and 6,864 MHz from the group PLL are selected by one selector and, after that, supplied to one of input terminals of an SSB mixer. The two band frequency signals of 1,056 MHz and 211 MHz from the band PLL are selected by another selector and, after that, supplied to an input terminal of a tri-mode divider. One of a DC voltage, a signal of 528 MHz, and a signal of 1,056 MHz as an output of the tri-mode divider is supplied to the other input terminal of the SSB mixer. By the SSB mixer, a final local signal can be generated. By using the technique described in the non-patent document 1, seven sub-band center frequencies (3,432, 3,960, 4,488, 5,544, 6,072, 6,600, and 7,128 (unit: MHz) assigned to a range from about 3 GHz to about 8 GHz can be generated.

The SSB mixer of the local signal generator is formed by two basic mixers and an output buffer. The signal of 3,432 MHz or 6,864 MHz as a group frequency signal of the group PLL from the output terminal of one selector and any of the DC voltage, the 528 MHz signal, and the 1,056 MHz signal from the output terminal of the tri-mode divider are supplied to the two basic mixers. The output buffer connected to the output terminals of the two basic mixers selects and outputs a specific sub-band frequency. Each of the two basic mixers employs a resonant circuit whose resonant frequency is tuned to output frequency in order to output one of three or four sub-band center frequencies. The resonant circuit includes an inductor, a plurality of capacitors, and a plurality of switches. One end of each of the capacitors is connected to the inductor, and the other end of each of the capacitors is connected to the ground potential via the switches. Tuning of the resonant circuit is realized by on/off control of the switches. However, to perform high frequency operation of a few GHz, it is important to provide the inductor in the resonant circuit in the integrated circuit. As shown in the chip micrograph of the non-patent document 1, the inductor is realized as a spiral inductor. The spiral inductor is a passive element obtained by spirally winding a wire to realize desired inductance but has a drawback that the occupied area is large.

In the case of the basic mixer for the low frequency side as described in the non-patent document 1, the spiral inductor occupies the area of 150 μm×150 μm on the chip. Consequently, the two spiral inductors of the basic mixers performing the differential operation occupy the area of 300 μm×150 μm in total. In the case of the basic mixer for the high frequency side as well, the two spiral inductors occupy the area of 200 μm×100 μm in total. In the non-patent document 1, the local signal generator is realized by occupying the area of 1,300 μm×1,100 μm (1.3 mm×1.1 mm) on the chip. The area occupied by the spiral inductor used in the basic mixer is about 5%. As described above, the resonant circuit employing the spiral inductor has a drawback that the chip occupied area is large.

The method of changing the resonant circuit by switching, with the switch, the value of the capacitance in the resonant circuit employed in the non-patent document 1 has a drawback such that the maximum value of the resonance impedance changes with the resonant frequency. When the inductance of the spiral inductor is L, the quality factor is Q, and the capacitance of the capacitor is C, the maximum value $Z_{mag}^{max}$ of the resonance impedance is expressed by the following equation.

Equation 1

$$Z_{mag}^{max} = \sqrt{(1+Q^2)\cdot\left(\frac{L}{C}\right)} \tag{1}$$

It is obvious from the equation 1 that when the value of C is changed in a state where L is constant, the maximum value $Z_{mag}^{max}$ changes. For example, in the case where Q=15, that is, parasitic resistance R series with the inductor is 2.5 ohms, L=1 nH, and C=0.5 to 1.5 pF, the resonant frequency varies to 7.2 GHz to 4.2 GHz. The maximum value $Z_{mag}^{max}$ largely changes to 742 ohms to 244 ohms. Therefore, a problem occurs such that, although the resonant frequency is switched by switching the capacitances, the maximum value of the load impedance in the non-patent document 1 changes and an output of the local signal generator fluctuates. From another viewpoint, according to non-linear characteristics of a circuit at the post stage of the local signal generator, a deviation of the output voltage swing of the local signal generator has to be suppressed, so that the variation range of the resonant frequency has to be also limited. As described above, since the conventional resonant circuit employs the spiral inductor, it has a drawback such that the occupied area is large. Since the conventional method of varying the resonant frequency of the resonant circuit is switching of the capacitance of capacitor banks arranged in parallel, there is also a drawback that the impedance at resonant frequency largely fluctuates.

As described in the non-patent document 4, by using the combination of the gyrator and the capacitor, the inductor can be emulated. However, the frequency range which can be covered is 0.4 GHz to 1.4 GHz. The frequency range is much narrower than that of the UWB wireless communication in the MB-OFDM system.

As described in the non-patent document 3, the center frequency of a filter employing a gyrator capable of equivalently converting a capacitor to an inductor can be adjusted by the value of bias current of a transconductance circuit as a component of the gyrator. The ratio between the center frequency 3,432 MHz of the first sub-band which is the lowest in the frequency arrangement for the UWB wireless communication shown in FIG. 2 and the center frequency 10,296 MHz of the fourteenth sub-band which is the highest is 1:3. To triple the center frequency of the filter employing the gyrator, the conductance of one of two transconductance circuits whose input and output terminals are connected in a closed loop has to be reduced to ⅑. For the reduction, the value of the bias current of the transconductance circuit has to be increased by ten times or more. The inventors of the present invention have revealed a problem that power consumption increases conspicuously.

The present invention has been achieved as a result of study of the inventors herein prior to the present invention. An object of the present invention is therefore to provide a wide-area RF signal processing circuit having a small chip occupied area and low power consumption. Another object of the present invention is to reduce a large deviation of the resonance impedance only by a change in the resonant frequency.

The above and other objects and novel features of the present invention will become apparent from the description of the specification and the appended drawings.

Representative ones of inventions disclosed in the present invention will be described briefly as follows.

A semiconductor integrated circuit as a representative invention includes, on a semiconductor chip, a resonant circuit including a first capacitor (1) which can be controlled by a first control signal (Vc1) applied to a first control terminal (101), and a gyrator (2, 5) for equivalently emulating an inductor (L) by including a second capacitor (3) which can be controlled by a second control signal (Vc2) applied to a second control terminal (102) (refer to FIG. 1).

Effects obtained by the representative ones of the inventions disclosed in the specification will be briefly described. The wide-area RF signal processing circuit realizing a small chip-occupied-area and low power consumption can be provided.

DETAILED DESCRIPTION OF THE PREFERRED EMBODIMENTS

Representative Embodiments

Figure 1:
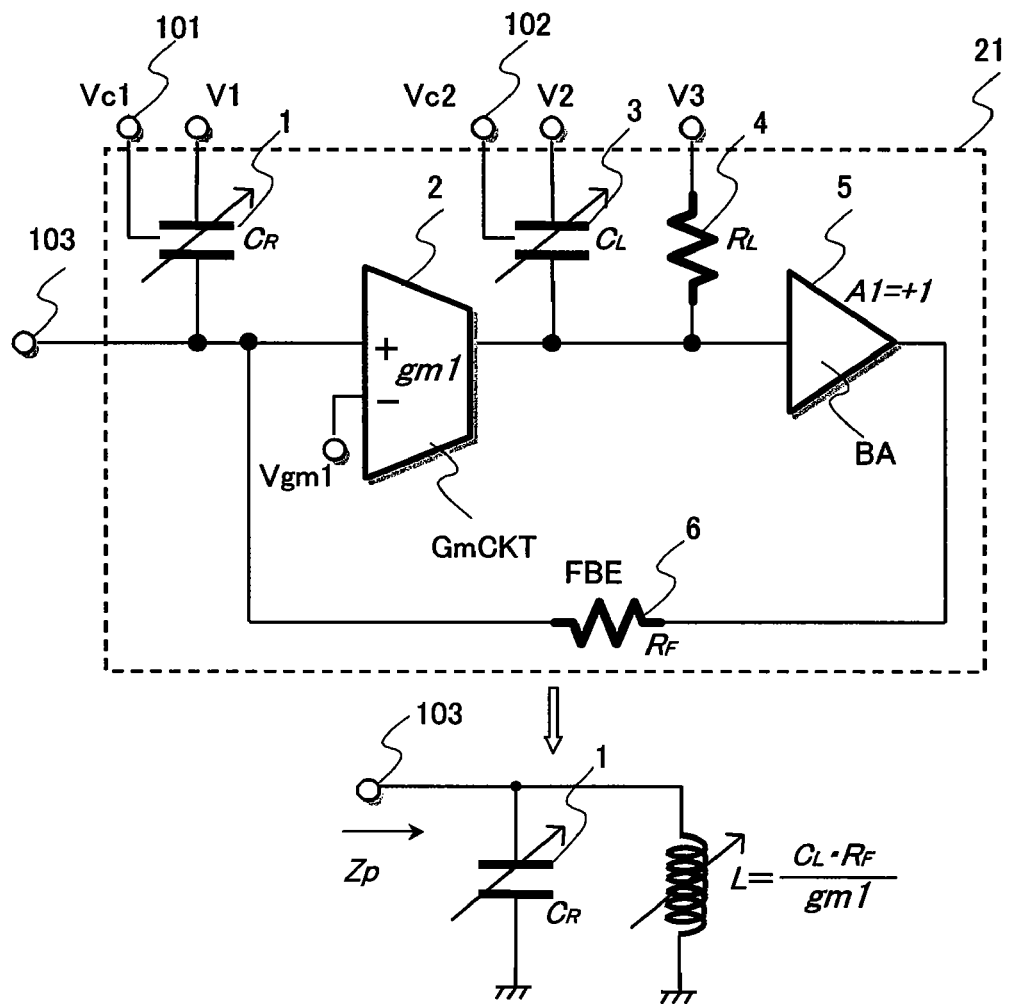
FIG. 1 is a diagram showing the configuration of a parallel-resonant circuit formed on a semiconductor chip of a semiconductor integrated circuit as an embodiment of the present invention.

First, outline of representative embodiments of the present invention disclosed in the specification will be described. Reference numerals in the diagram in parenthesis used for describing outline of the representative embodiments merely indicate components included in the concept.

(1) A semiconductor integrated circuit as a representative embodiment of the present invention includes, on a semiconductor chip, a resonant circuit including a first capacitor (1) having a capacitance ($C_R$) which can be controlled by a first control signal (Vc1) applied to a first control terminal (101), and a gyrator (2, 5) for equivalently emulating an inductor (L) by including a second capacitor (3) having a capacitance ($C_L$) which can be controlled by a second control signal (Vc2) applied to a second control terminal (102) (refer to FIG. 1).

According to the embodiment, the resonant circuit is realized by not a spiral inductor having a large chip occupied area but the combination of the gyrator and the capacitor, so that the chip occupied area can be reduced. In addition, setting of the resonant frequency is realized by not the control on the bias current of the transconductance circuit as a component of the gyrator but the control on the capacitances of the first and second capacitors. Thus, increase in power consumption can be avoided.

In the semiconductor integrated circuit in a preferred embodiment, by equivalently connecting the first capacitor and the inductor in parallel, the resonant circuit becomes a parallel-resonant circuit (refer to FIG. 1).

By controlling at least one of the capacitance of the first capacitor and the capacitance of the second capacitor, parallel resonant frequency of the parallel-resonant circuit can be set to desired frequency (refer to FIG. 3).

Figure 4:
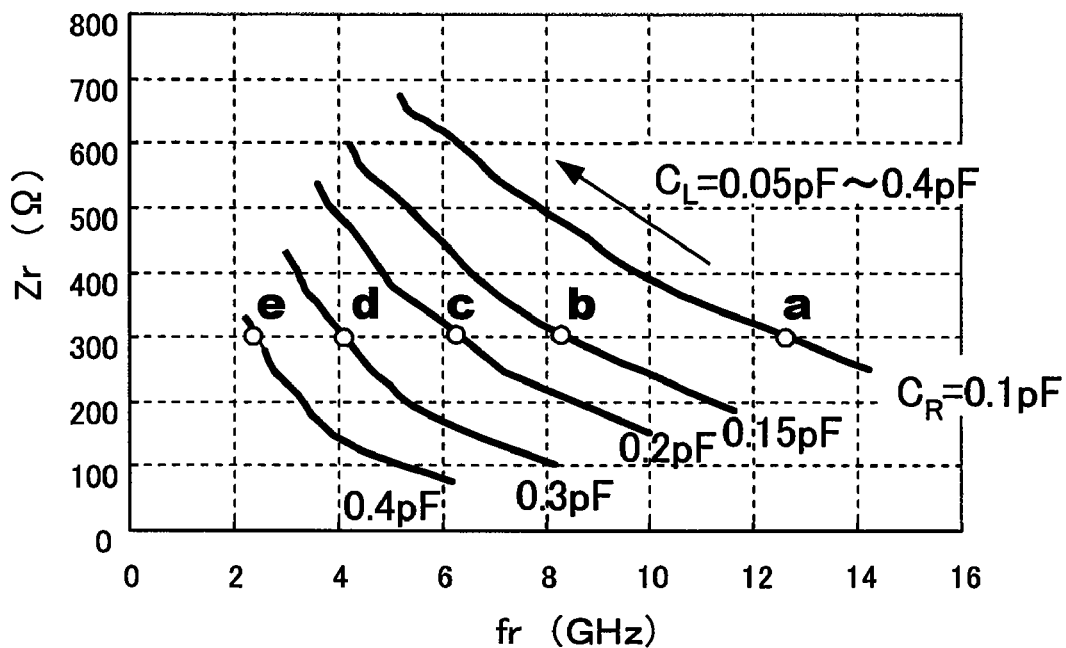
FIG. 4 is a diagram showing frequency dependency of impedance of a signal terminal of the parallel-resonant circuit of FIG. 1 in the case where the capacitances of two variable capacitors are changed coordinately.

In the semiconductor integrated circuit in another preferred embodiment, at the time of changing the parallel resonant frequency of the parallel-resonant circuit to the desired frequency, the capacitance of the first capacitor and the capacitance of the second capacitor are coordinately changed by the first and second control signals (refer to FIG. 4).

In the another preferred embodiment, at the time of changing the parallel resonant frequency to the desired frequency, the capacitance of the first capacitor and the capacitance of the second capacitor are coordinately changed. As a result, first impedance by the capacitance of the first capacitor changes to either increase or decrease, and second impedance of the equivalent inductor by the capacitance of the second capacitor changes to the opposite side. Therefore, at the time of changing the parallel resonant frequency to the desired frequency, large fluctuation in the impedance at resonant frequency can be reduced (refer to FIG. 5).

Figure 17:
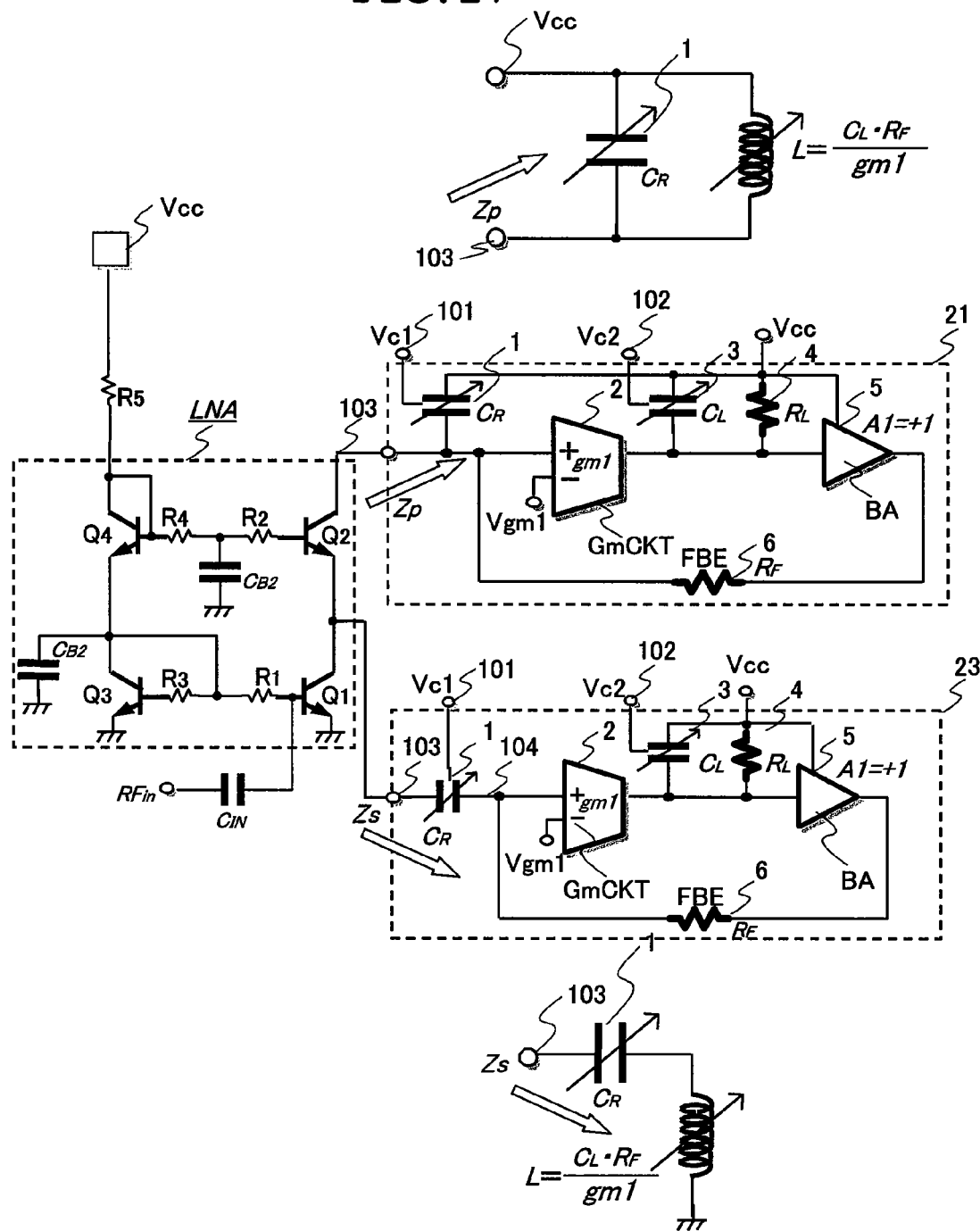
FIG. 17 is a diagram showing an RF low noise amplifier formed on a semiconductor chip of a semiconductor integrated circuit as another embodiment of the invention.
Figure 18:
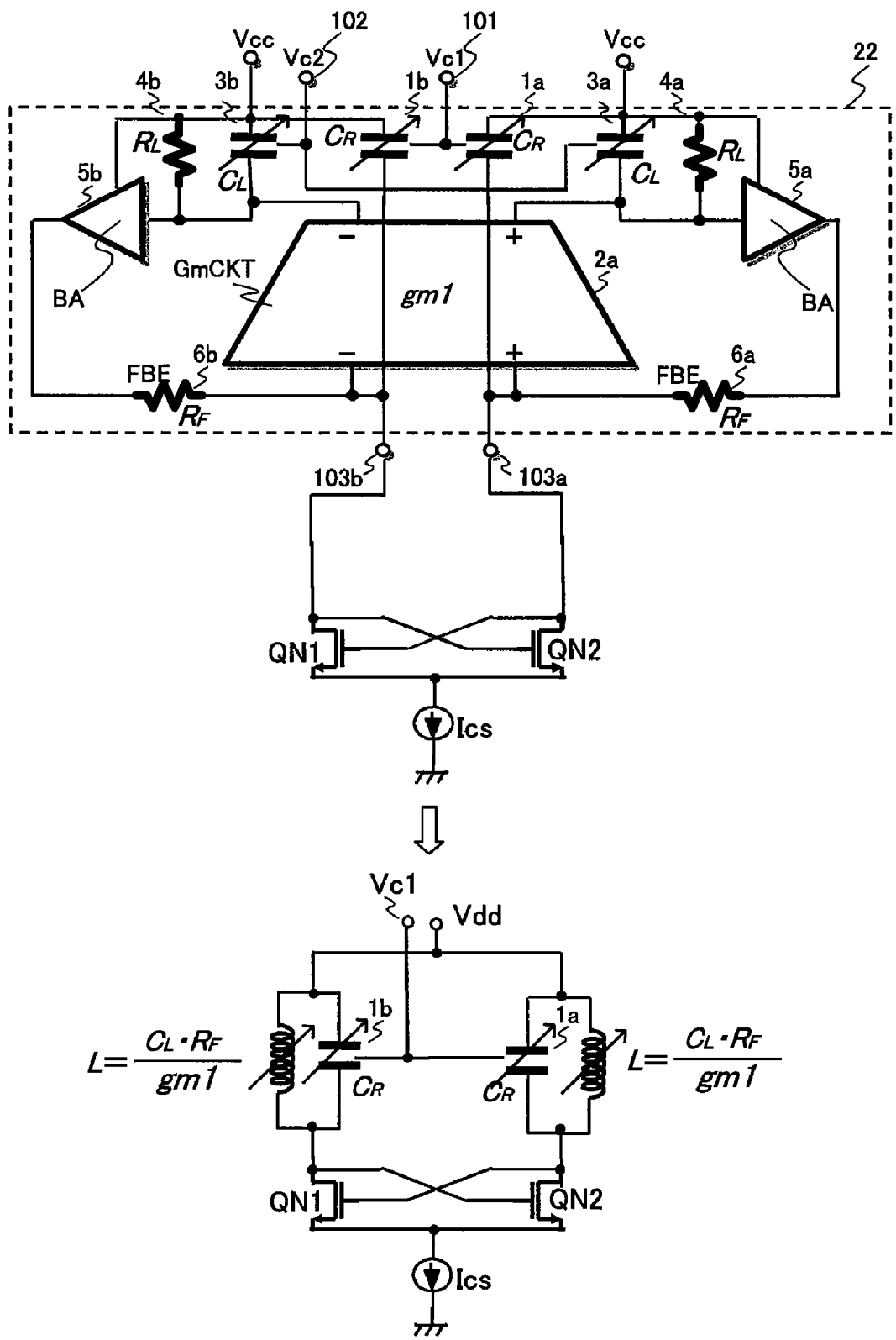
FIG. 18 is a diagram showing the configuration of a voltage controlled oscillator of a frequency synthesizer for generating a reception local signal to be supplied to a reception mixer and a transmission local signal to be supplied to a transmission mixer.
Figure 19:
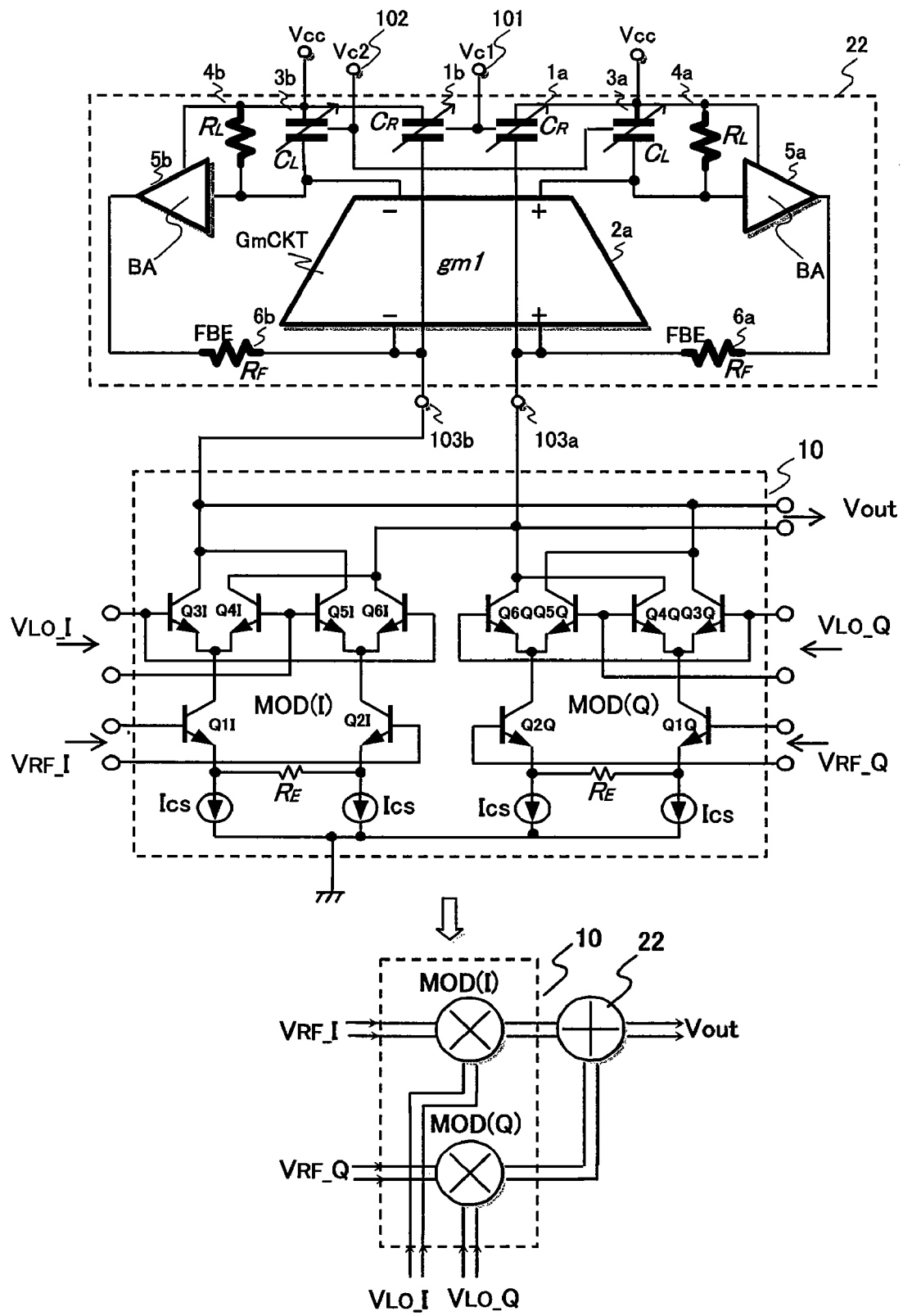
FIG. 19 is a diagram showing the configuration of an SSB mixer comprised of two double-balanced mixers formed on a semiconductor chip of a semiconductor integrated circuit as another embodiment of the invention.

In a semiconductor integrated circuit in a more preferred embodiment, the parallel-resonant circuit is an active load connected to an output node of an amplifier (Q1) (refer to FIGS. 17, 18, and 19).

In a semiconductor integrated circuit in a further preferred embodiment, the amplifier is at least a component which composes one of a low noise amplifier, a voltage controlled oscillator, and a mixer (refer to FIGS. 17, 18, and 19).

In a semiconductor integrated circuit in further another preferred embodiment, the gyrator includes: a first transconductance circuit (2) for generating current to be supplied to the capacitance of the second capacitor in response to voltage of the capacitance of the first capacitor at its input terminal; and a second transconductance circuit (5, 6) for feeding back current responding to the voltage of the capacitance of the second capacitor to the input terminal of the first transconductance circuit.

Figure 6:
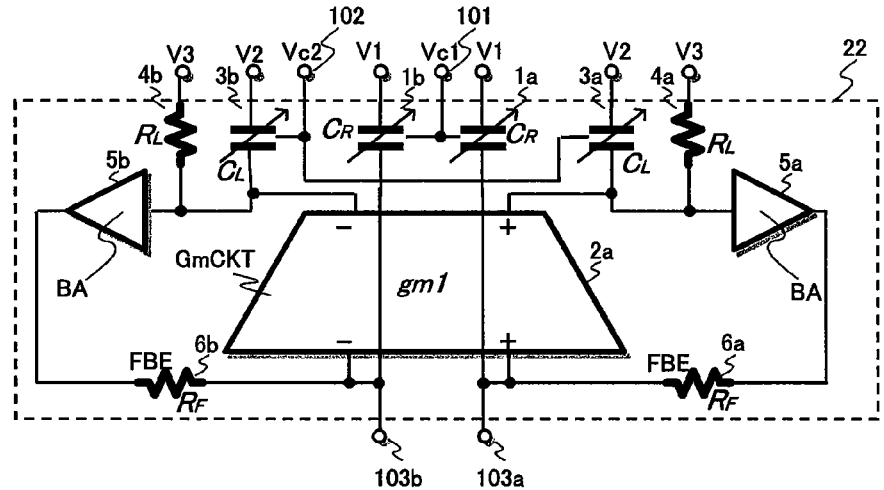
FIG. 6 is a diagram showing the configuration of a resonant circuit formed on a semiconductor chip of a semiconductor integrated circuit as another embodiment of the invention.

In the semiconductor integrated circuit as further another preferred embodiment, the first transconductance circuit is a first differential transconductance circuit (2a) for generating differential current to be supplied to capacitances of a pair of second capacitors in response to differential voltage of capacitances of a pair of first capacitors at differential input terminals, and the second transconductance circuit is a second differential transconductance circuit (5a, 5b) for generating differential current to be supplied to the capacitances of the pair of first capacitors in response to differential voltage of the capacitances of the pair of second capacitors at the differential input terminals (refer to FIG. 6).

In the further another preferred embodiment, the first transconductance circuit has a common mode rejection ratio (CMRR) higher than a common-mode input signal supplied to the differential input terminal.

Figure 9:
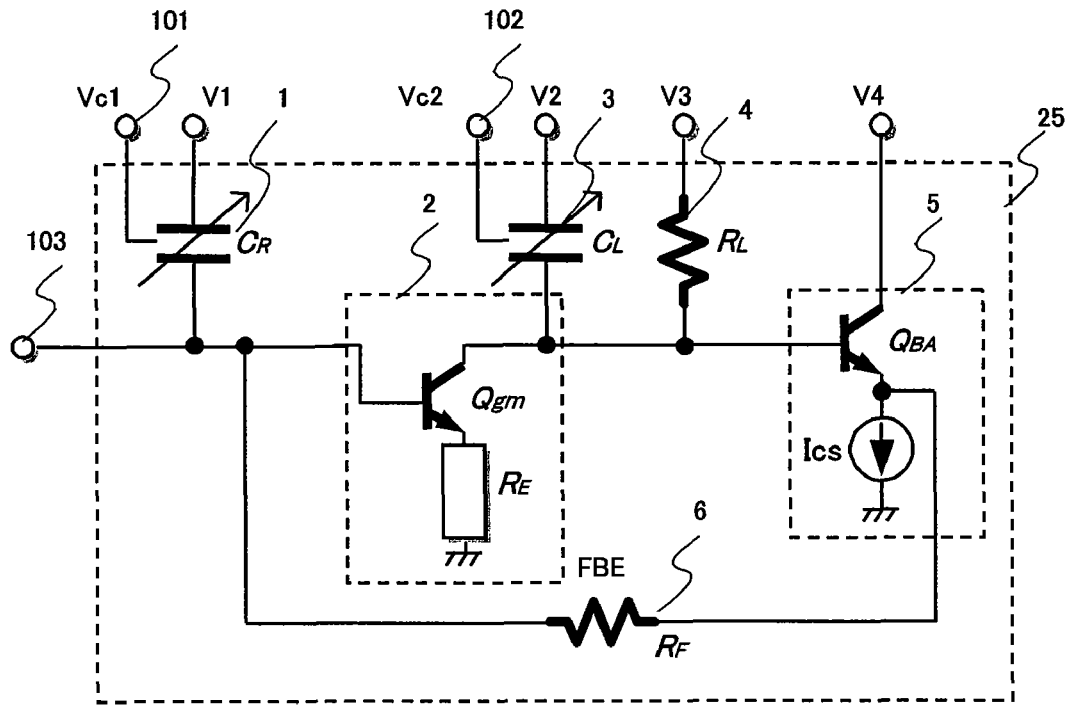
FIG. 9 is a diagram showing a parallel-resonant circuit formed on the semiconductor chip of the semiconductor integrated circuit and comprised of a bipolar transistor according to the embodiment of the present invention of FIG. 1.
Figure 11:
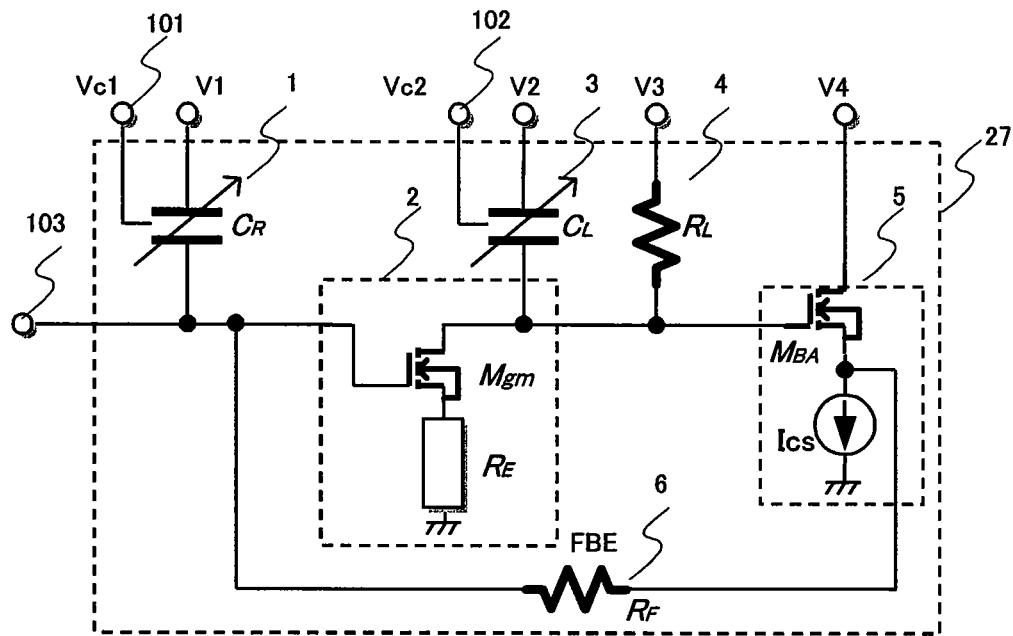
FIG. 11 is a diagram showing the case where NPN-type bipolar transistors in the transconductance circuit and a buffer circuit of the parallel-resonant circuit formed on the semiconductor chip of the semiconductor integrated circuit as the embodiment of the invention illustrated in FIG. 9 are replaced with N-channel-type MOS field effect transistors.

In the semiconductor integrated circuit as further another preferred embodiment, the first transconductance circuit includes either a common-emitter bipolar transistor (Qgm) whose emitter is connected to an AC ground potential node via a resistor ($R_E$) or a common-source field effect transistor (Mgm) whose source is connected to an AC ground potential node via a resistor ($R_E$) (refer to FIGS. 9 and 11).

In the semiconductor integrated circuit as further another preferred embodiment, the second transconductance circuit includes a buffer circuit (5) and a feedback resistor (6) (refer to FIGS. 9 and 11).

In the semiconductor integrated circuit as a most concrete embodiment, the buffer circuit includes either an emitter follower ($Q_{BA}$, Ics) or a source follower ($M_{BA}$, Ics) (refer to FIGS. 9 and 11).

In the semiconductor integrated circuit as another concrete embodiment, the first and second control signals are digital or analog signals (refer to FIGS. 9 and 11).

In the semiconductor integrated circuit as a most concrete embodiment, the digital signal is a band selection signal made of a plurality of bits for selecting any of a plurality of radio frequency bands for wireless communication.

Figure 7:
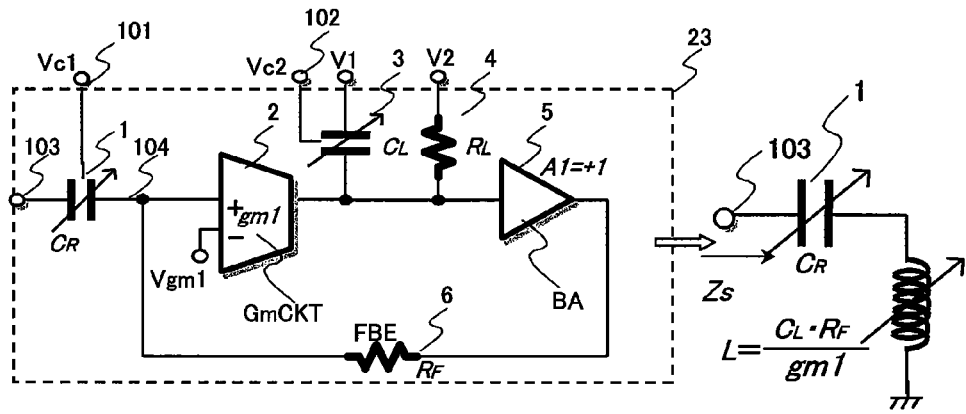
FIG. 7 is a diagram showing the configuration of a series-resonant circuit formed on a semiconductor chip of a semiconductor integrated circuit as another embodiment of the invention.

In the semiconductor integrated circuit as another preferred embodiment, the first capacitor and the inductor are equivalently connected in series, thereby making the resonant circuit a series resonant circuit (refer to FIG. 7).

By controlling at least one of the capacitance of the first capacitor and the capacitance of the second capacitor, series resonant frequency of the series resonant circuit is set to desired frequency.

In the semiconductor integrated circuit as another preferred embodiment, at the time of changing the series resonant frequency of the series resonant circuit to the desired frequency, the capacitance of the first capacitor and the capacitance of the second capacitor are coordinately changed by the first and second control signals.

In the another preferred embodiment, at the time of changing the series resonant frequency to the desired frequency, the capacitance of the first capacitor and the capacitance of the second capacitor are coordinately changed. As a result, the first impedance by the capacitance of the first capacitor changes to either increase or decrease, and second impedance of the equivalent inductor by the capacitance of the second capacitor changes to the opposite side. Therefore, at the time of changing the series resonant frequency to the desired frequency, large fluctuation in the impedance at resonant frequency can be reduced.

In the semiconductor integrated circuit as a more preferred embodiment, the series resonant circuit is a notch filter connected to an output node of an amplifier, and the notch filter suppresses level of an unwanted signal having a frequency almost equal to the series resonant frequency (refer to FIG. 17).

In the semiconductor integrated circuit as another more preferred embodiment, the amplifier processes a signal in two or more frequency bands selected from a frequency range from about 2 GHz to about 14 GHz.

In the semiconductor integrated circuit as another preferred embodiment, the first capacitor and the inductor are connected equivalently in a series connection form, and a characteristic frequency obtained by the series connection can be set to a desired frequency by suppressing at least one of the capacitance of the first capacitor and the capacitance of the second capacitor.

In the semiconductor integrated circuit as another preferred embodiment, at the time of changing the characteristic frequency by the series connection to the desired frequency, the capacitance of the first capacitor and the capacitance of the second capacitor are coordinately changed by the first and second control signals.

(2) A semiconductor integrated circuit as a representative embodiment from another aspect of the present invention includes, on a semiconductor chip, an amplifier (Q1) and an active load connected to an output node of the amplifier.

The active load includes: a first capacitor (1) having a capacitance ($C_R$) which can be controlled by a first control signal (Vc1) to be applied to a first control terminal (101); and a gyrator (2, 5) for equivalently emulating an inductor (L) by including a second capacitor (3) having a capacitance ($C_L$) which can be controlled by a second control signal (Vc2) to be applied to a second control terminal (102).

In the active load (21), the first capacitor (1) and the inductor (L) are equivalently connected in parallel (refer to FIG. 17).

In the semiconductor integrated circuit as a preferred embodiment, by controlling at least one of the capacitance of the first capacitor and the capacitance of the second capacitor, the parallel resonant frequency of the active load can be set to a desired frequency (refer to FIG. 3).

In the semiconductor integrated circuit as another preferred embodiment, at the time of changing the parallel resonant frequency of the active load to the desired frequency, the capacitance of the first capacitor and the capacitance of the second capacitor are coordinately changed by the first and second control signals (refer to FIG. 4).

In the another preferred embodiment, at the time of changing the parallel resonant frequency to the desired frequency, the capacitance of the first capacitor and the capacitance of the second capacitor are coordinately changed. As a result, the first impedance by the capacitance of the first capacitor changes to either increase or decrease, and second impedance of the equivalent inductor by the capacitance of the second capacitor changes to the opposite side. Therefore, at the time of changing the parallel resonant frequency to the desired frequency, large fluctuation in the impedance at resonant frequency can be reduced (refer to FIG. 5).

In the semiconductor integrated circuit as another most concrete embodiment, the amplifier processes a signal in two or more frequency bands selected from a frequency range from about 2 GHz to about 14 GHz.

DESCRIPTION OF EMBODIMENTS

Embodiments will be described further in detail.

Parallel-Resonant Circuit Formed by Gyrator

FIG. 1 is a diagram showing the configuration of a parallel resonant circuit formed on a semiconductor chip of a semiconductor integrated circuit as an embodiment of the present invention. The parallel resonant circuit shown in FIG. 1 is basically configured by parallel connection between a variable capacitor 1 and a gyrator. A single-ended type gyrator includes a transconductance circuit 2, a variable capacitor 3, a damping resistor 4, a buffer circuit 5, and a feedback resistor 6. Capacitance $C_R$ of the variable capacitor 1 is variably controlled by a control voltage Vc1 applied to a control terminal 101. The transconductance circuit 2 generates output current responding to input voltage across a non-inversion input terminal + and an inversion input terminal −. The capacitance $C_L$ of the variable capacitor 3 is variably controlled by control voltage Vc2 applied to a control terminal 102. The output current of the transconductance circuit 2 flows in the parallel connection of the variable capacitor 3 and the resistor 4, and current-voltage conversion is performed in the parallel connection. A signal voltage of the parallel connection is fed back to the non-inversion input terminal + of the transconductance circuit 2 via the buffer circuit 5 and the feedback resistor 6. The buffer circuit 5 is a voltage follower in which the value of voltage gain A1 is set to 1. The buffer circuit 5 and the feedback resistor 6 operate as a transconductance circuit. Output current of the transconductance circuit flows in the variable capacitor 1 of a signal terminal 103 of the resonant circuit.

In the configuration of the resonant circuit, one end of the variable capacitor 1 and the other end thereof are connected to a terminal for supplying a predetermined operation voltage V1 and the non-inversion input terminal + of the transconductance circuit 2, respectively. The insertion input terminal − and the output terminal of the transconductance circuit 2 are connected to a terminal for supplying a predetermined bias voltage Vgm1 and an input terminal of the buffer circuit 5, respectively. One end of the variable capacitor 3 and the other end thereof are connected to a terminal for supplying a predetermined operation voltage V2 and the output terminal of the transconductance circuit 2, respectively. One end of the resistor 4 and the other end thereof are connected to a terminal for supplying a predetermined operation voltage V3 and the output terminal of the transconductance circuit 2, respectively. The output of the buffer circuit 5 is connected to one end of the feedback device 6, and the other end of the feedback device 6 is connected to the non-inversion input terminal + of the transconductance circuit 2. In the configuration, the non-inversion input terminal + of the transconductance circuit 2 is set as the signal terminal 103 of the resonant circuit, and a predetermined impedance characteristic of the signal terminal 103 is used. That is, like a gyrator, by the conductance of the transconductance circuit 2, the variable capacitor 3, and the feedback device 6, an equivalent conversion inductor L is formed at the signal terminal 103 of the resonant circuit. At the signal terminal 103 of the resonant circuit, a parallel resonant circuit is formed by the capacitance $C_R$ of the variable capacitor 1 and the equivalent inductor L.

As a result, in the resonant circuit shown in FIG. 1, the impedance of the parallel resonant circuit formed by the variable capacitor 1 of the signal terminal 103 and the equivalent inductor L can be changed by the control voltage applied to the control terminals 101 and 102 of the variable capacitors 1 and 3. As well known, the impedance of the LC parallel-resonant circuit becomes the maximum at the resonant frequency. By changing the capacitances $C_R$, $C_L$ of the variable capacitors 1 and 3, the resonant frequency, resonance impedance, and resonance band can be variably controlled.

Impedance Zp of the signal terminal 103 of the parallel resonant circuit shown in FIG. 1 will be analyzed below.

First, the capacitance of the variable capacitor 1 is set as $C_R$, the conductance of the transconductance circuit 2 is set as gm1, the capacitance of the variable capacitor 3 is set as $C_L$, the resistance value of the resistor 4 is set as $R_L$, the value of the voltage gain A1 of the buffer circuit 5 is assumed as 1, and the resistance value of the feedback resistor 6 is $R_F$, the impedance Zp of the signal terminal 103 of the resonant circuit shown in FIG. 1 is obtained by the following equation 2.

Equation 2

$$Zp = \frac{1 = s \cdot C_L \cdot R_L}{\frac{gm1 \cdot R_L}{R_F} + s \cdot \left(C_R + \frac{R_L \cdot C_L}{R_F}\right) + s^2 \cdot C_L \cdot R_L \cdot C_R} \quad (2)$$

Where s denotes the product of a complex sign "j" and angular frequency ω. The angular frequency ω shows the product of frequency "f" and 2π.

The equation 2 is arranged as the equation 3.

Equation 3

$$Zp = \frac{1}{C_R} \frac{s + \frac{1}{C_L R_L}}{s^2 + \frac{C_R R_F + C_L R_L}{C_L R_L C_R} s + \frac{gm1 R_L}{C_L R_F C_R R_L}} \quad (3)$$

The equation 3 is compared with the equation 4 below. From the denominator, natural frequency ωn and its damping factor ζ can be obtained by the following equations 5 and 6.

Equation 4

$$Zp = K \frac{s + a}{s^2 + 2 \cdot \zeta \cdot \omega_n s + \omega_n^2} \quad (4)$$

Equation 5

$$\omega_n = \sqrt{\frac{gm1 \cdot R_L}{C_R C_L R_F R_L}} \quad (5)$$

Equation 6

$$\zeta = \frac{C_R R_F + C_L RF}{2 R_L} \cdot \sqrt{\frac{R_F}{gm1 \cdot C_L \cdot C_R}} \quad (6)$$

In the impedance of the parallel resonant circuit having the configuration of FIG. 1, the angular frequency of the resonant frequency can be expressed by the natural frequency of the equation 5. Therefore, from the equation 5, the equivalent inductor L at the signal terminal 103 of the parallel resonant circuit formed by the conductance gm1 of the transconductance circuit 2, the capacitance $C_L$ of the variable capacitor 3, and the resistance value $R_F$ of the feedback device 6 can be obtained by the following equation 7.

Equation 7

$$L = \frac{C_L R_F}{gm1} \quad (7)$$

Since the predetermined operation voltages V1, V2, and V3 are at the AC grounding points, as shown in the equivalent circuit in the lower part of FIG. 1, the capacitance $C_L$ of the variable capacitor 3 and the equivalent inductor L are connected in parallel between the signal terminal 103 and the grounding points.

Therefore, the inductance of the equivalent inductor L at the signal terminal 103 of the parallel resonant circuit can be adjusted by changing the capacitance $C_L$ of the variable capacitor 3. When the capacitance $C_L$ of the variable capacitor 3 is increased by the control voltage Vc2 applied to the control terminal 102, the equivalent inductance L increases, and the parallel resonant frequency can be lowered. On the contrary, when the capacitance $C_L$ of the variable capacitor 3 is decreased by the control voltage Vc2 applied to the control terminal 102, the equivalent inductance L decreases, and the parallel resonant frequency can be increased.

Further, by increasing the capacitance $C_R$ of the variable capacitor 1 connected in parallel with the equivalent inductor L by the control voltage Vc1 applied to the control terminal 101, the parallel resonant frequency can be lowered. On the contrary, by decreasing the capacitance $C_R$ of the variable capacitor 1 by the control voltage Vc1 applied to the control terminal 101, the parallel resonant frequency can be increased. In such a manner, by properly changing the capacitances $C_L$ and $C_R$ of the two variable capacitors 1 and 3 of the parallel resonant circuit of FIG. 1, the parallel resonant frequency can be controlled in a wide range.

As the absolute value of the impedance Zp of the parallel resonant circuit, it is sufficient to replace the expression of "s" with the angular frequency ω or frequency "f" using s=j·ω=j·2πf in the equation 3 and obtain the absolute value in the case of the angular frequency ω or frequency "f". Therefore, the impedance Zp of the parallel resonant circuit becomes the maximum at the angular frequency (resonant angular frequency) of ωn shown in the equation 5. The maximum resonance impedance becomes a value obtained by substitution of s=j·ωn in the equation 3.

Figure 3A:
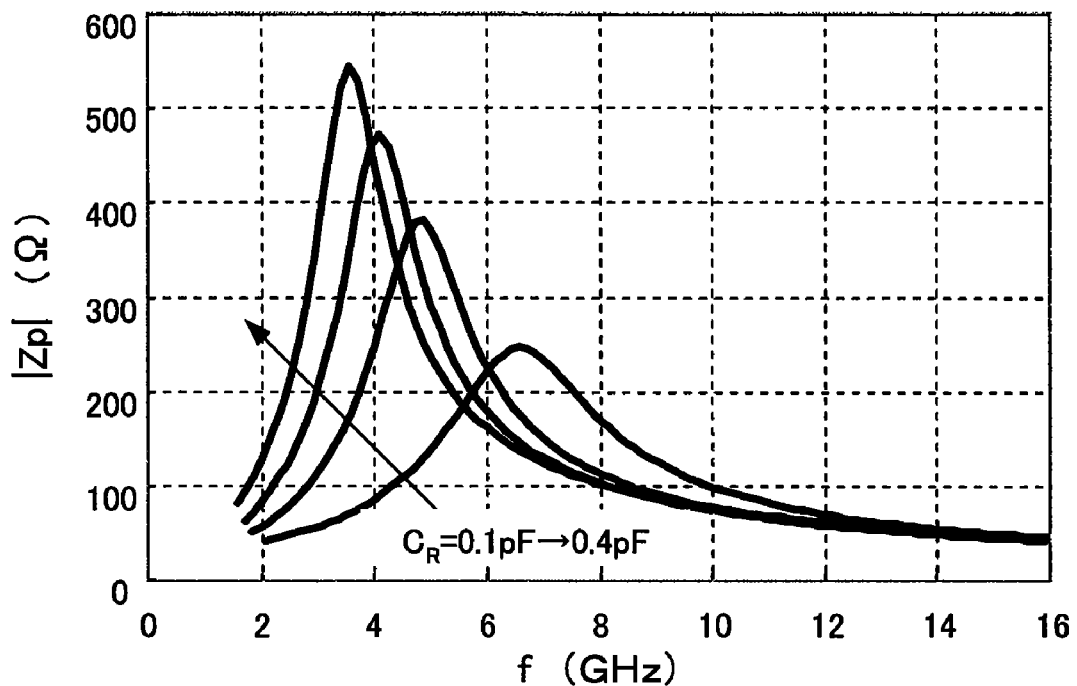
FIGS. 3A and 3B are diagrams showing calculation results of the absolute value of impedance of a signal terminal of a parallel-resonant circuit of FIG. 1.
Figure 3B:
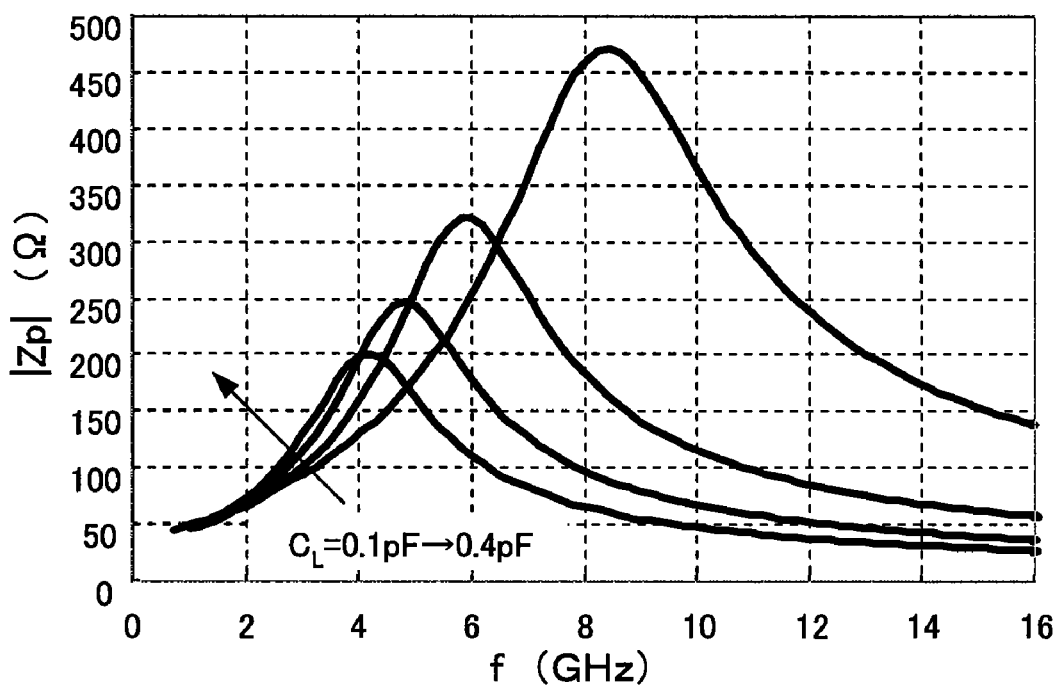

FIGS. 3A and 3B show results of calculation of the absolute value |Zp| of the impedance of the signal terminal 103 of the parallel resonant circuit of FIG. 1 obtained by the equation 3.

FIG. 3A shows frequency dependence of the absolute value of the impedance Zp of the parallel resonant circuit in the case where gm1=40 mS, $R_L$=1 KΩ, $R_F$=1 KΩ, $C_L$=0.15 pF, and $C_R$ is changed by 0.1 pF from 0.1 pF to 0.4 pF. As the value of the capacitance $C_R$ of the variable capacitor 1 increases, the resonant angular frequency (in the diagram, resonant frequency) decreases, and the absolute value of the resonance impedance Zp tends to increase.

FIG. 3B shows frequency dependence of the absolute value of the impedance Zp of the parallel resonant circuit in the case where gm1=40 mS, $R_L$=1 KΩ, $R_F$=1 KΩ, $C_R$=0.2 pF, and $C_L$ is changed by 0.1 pF from 0.1 pF to 0.4 pF. As the capacitance $C_L$ of the variable capacitor 3 increases, the resonant angular frequency (in the diagram, resonant frequency) decreases, and the absolute value of the resonance impedance Zp tends to decrease.

FIG. 4 is a diagram showing frequency dependence of the impedance at the signal terminal 103 of the parallel resonant circuit of FIG. 1 in the case where the capacitance $C_L$ of the variable capacitor 3 and the capacitance $C_R$ of the variable capacitor 1 are changed coordinately. The horizontal axis of FIG. 4 denotes resonant frequency "fr", and the vertical axis of FIG. 4 denotes the resonance impedance Zr. FIG. 4 shows the characteristics of the case where the capacitance $C_R$ of the variable capacitor is changed from 0.1 pF to 0.4 pF, and the capacitance $C_L$ of the variable capacitor 3 is changed from 0.05 pF to 0.4 pF. Specifically, in FIG. 4, $C_R$ is set as 0.1 pF and $C_L$ is set as 0.05 pF at point "a". $C_R$ is set as 0.15 pF and $C_L$ is set as 0.1 pF at point "b". $C_R$ is set as 0.2 pF and $C_L$ is set as 0.2 pF at point "c". $C_R$ is set as 0.3 pF and $C_L$ is set as 0.3 pF at point "d". $C_R$ is set as 0.4 pF and $C_L$ is set as 0.4 pF at point "e". It can be understood from FIG. 4 that, by properly changing the capacitances $C_L$ and $C_R$ of the two variable capacitors 1 and 3 of the parallel resonant circuit of FIG. 1, the parallel resonant frequency and the parallel resonance impedance can be controlled in wide range.

Figure 5:
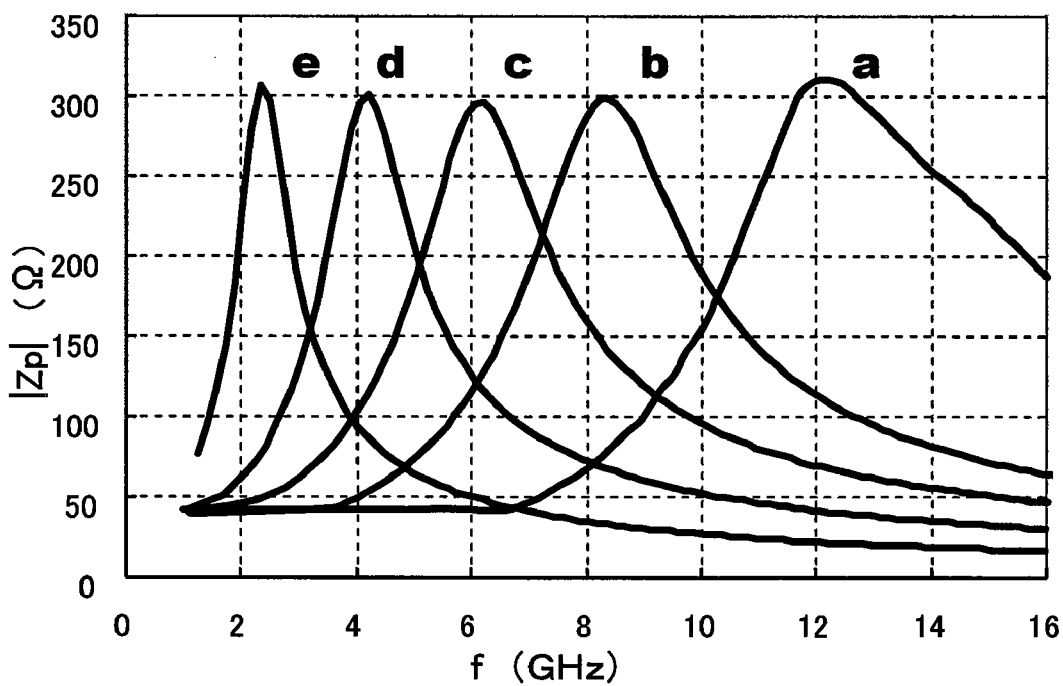
FIG. 5 is a diagram showing frequency dependency of impedance of a signal terminal of the parallel-resonant circuit of FIG. 1 in the case of values of the two capacitances at five points in FIG. 4.

FIG. 5 is a diagram showing the frequency dependence of the impedance at the signal terminal 103 of the parallel resonant circuit of FIG. 1 in the case of the values of the two capacitances $C_L$ and $C_R$ at the five points a, b, c, d, and e in FIG. 4. It can be understood from FIG. 5 that the resonant frequency and the resonance impedance can be arbitrarily controlled in an extremely wide frequency band of about 2 GHz to about 14 GHz. That is, the natural frequency ωn corresponding to the resonant frequency fr of the parallel resonant circuit of FIG. 1 is inversely proportional to the square root of the product between the capacitance $C_R$ of the variable capacitor 1 and the capacitance $C_L$ of the variable capacitor 3 as shown in the equation 5. At the time of decreasing the resonant frequency fr of the parallel resonance circuit of FIG. 1, the capacitance $C_R$ of the variable capacitor 1 and the capacitance $C_L$ of the variable capacitor 3 are coordinately increased by the control voltages Vc1 and Vc2. As a result, the capacitance $C_R$ of the variable capacitor 1 and the impedance by the variable capacitor 3 decrease and the impedance of the equivalent inductor L by the capacitance $C_L$ of the variable capacitor 3 increases. Therefore, at the time of changing the resonant frequency fr of the parallel resonant circuit of FIG. 1 to desired frequency, large fluctuations in the resonance impedance can be reduced as shown in FIG. 5.

It can be understood from FIG. 5 that the parallel resonant circuit shown in FIG. 1 can be used as a bandpass filter having an arbitrary resonant frequency in the extremely wide frequency band from about 2 GHz to about 14 GHz.

Parallel Resonant Circuit by Full-Differential Transconductance Circuit

FIG. 6 is a diagram showing the configuration of a resonance circuit formed on a semiconductor chip of a semiconductor integrated circuit as another embodiment of the invention. The parallel resonant circuit shown in FIG. 6 employs a configuration for a differential signal. The parallel resonant circuit shown in FIG. 6 has a pair of variable capacitors 1a and 1b, a differential transconductance circuit 2a having a non-inversion input terminal +, an inversion input terminal −, a non-inversion output terminal +, and an inversion output terminal −, a pair of variable capacitors 3a and 3b, a pair of resistors 4a and 4b, a pair of buffer circuits 5a and 5b, and a pair of feedback resistors 6a and 6b. The capacitance of the pair of variable capacitors 1a and 1b is variably controlled by the control voltage Vc1 applied to the control terminal 101. The differential transconductance circuit 2a generates non-inversion output current and inversion output current responding to input voltage across the non-inversion input terminal + and the inversion input terminal − at the non-inversion output terminal + and the non-inversion output terminal −, respectively. The capacitance of the pair of variable capacitors 3a and 3b is variably controlled by the control voltage Vc2 applied to the control terminal 102.

Therefore, the parallel resonant circuit shown in FIG. 6 is a full-differential parallel resonant circuit obtained by developing the parallel resonant circuit in the form of the single-end circuit shown in FIG. 1 to the full-differential transconductance circuit. As a result, the full-differential parallel resonant circuit shown in FIG. 6 can be used as a bandpass filter having arbitrary resonant frequency in the extremely wide frequency band of about 2 GHz to about 14 GHz. Further, the full-differential parallel resonance circuit shown in FIG. 6 has high common mode rejection ratio (CMRR) to common-mode input signals supplied to the pair of signal terminals 103a and 103b.

Series Resonant Circuit Formed by Gyrator

FIG. 7 is a diagram showing the configuration of a series resonant circuit formed on a semiconductor chip of a semiconductor integrated circuit as another embodiment of the present invention. The series resonant circuit shown in FIG. 7 is different from the parallel resonant circuit shown in FIG. 1 with respect to the point that one end of the variable capacitor 1 is connected to the signal terminal 103. The other configuration is basically the same. As a result, the series resonant circuit shown in FIG. 7 is basically configured by series connection between the variable capacitor 1 and a gyrator.

Impedance Zs of the signal terminal 103 of the parallel resonant circuit shown in FIG. 7 will be analyzed below.

First, the capacitance of the variable capacitor 1 is set as $C_R$, the conductance of the transconductance circuit 2 is set as gm1, the capacitance of the variable capacitor 3 is set as $C_L$, the resistance value of the resistor 4 is set as $R_L$, the value of the voltage gain A1 of the buffer circuit 5 is assumed as 1, and the resistance value of the feedback resistor 6 is $R_F$, the impedance Zs of the signal terminal 103 of the series resonant circuit shown in FIG. 7 is obtained by the following equation 8.

Equation 8

$$Zs = R_F \frac{s^2 + \frac{C_L R_L + C_R R_F}{C_R R_F C_L R_L} s + \frac{1 + gm1 R_L}{C_R R_F C_L R_L}}{s\left(s + \frac{1 + gm1 R_L}{C_L R_L}\right)} \quad (8)$$

Where s denotes the product of a complex sign "j" and angular frequency ω. The angular frequency ω shows the product of frequency "f" and 2π.

From the numerator of the equation 8, the natural frequency ωn and the damping factor ζ can be expressed by equations 9 and 10, respectively.

Equation 9

$$\omega_n = \sqrt{\frac{1 + gm1 \cdot R_L}{C_R C_L R_F R_L}} \quad (9)$$

Equation 10

$$\varsigma = \frac{C_R R_F + C_L RF}{2} \cdot \sqrt{\frac{R_F}{(1 + gm1 R_L) \cdot R_L \cdot C_L \cdot C_R}} \quad (10)$$

In the impedance of the series resonant circuit shown in FIG. 7, the resonant frequency can be expressed by the natural frequency of the equation 9. Therefore, from the equation 9, the equivalent inductor L at the signal terminal 103 of the series resonant circuit formed by the conductance gm1 of the transconductance circuit 2, the capacitance $C_L$ of the variable capacitor 3, and the resistance value $R_F$ of the feedback device 6 can be obtained by the following equation 11.

Equation 11

$$L = \frac{C_L R_F}{\frac{1}{R_L} + gm1} \cong \frac{C_L R_F}{gm1} \quad (11)$$

Since the predetermined operation voltages V1 and V2 are at the AC grounding points, as shown in the equivalent circuit in the lower part of FIG. 7, the capacitance $C_L$ of the variable capacitor 3 and the equivalent inductor L are connected in series between the signal terminal 103 and the grounding points.

Therefore, the inductance of the equivalent inductor L at the signal terminal 103 of the series resonant circuit can be adjusted by changing the capacitance $C_L$ of the variable capacitor 3. When the capacitance $C_L$ of the variable capacitor 3 is increased by the control voltage Vc2 applied to the control terminal 102, the equivalent inductance L increases, and the series resonant frequency can be lowered. On the contrary, when the capacitance $C_L$ of the variable capacitor 3 is decreased by the control voltage Vc2 applied to the control terminal 102, the equivalent inductance L decreases, and the series resonant frequency can be increased.

Further, by increasing the capacitance $C_R$ of the variable capacitor 1 connected in series with the equivalent inductor L by the control voltage Vc1 applied to the control terminal 101, the series resonant frequency can be lowered. On the contrary, by decreasing the capacitance $C_R$ of the variable capacitor 1 by the control voltage Vc1 applied to the control terminal 101, the series resonant frequency can be increased. In such a manner, by properly changing the capacitances $C_L$ and $C_R$ of the two variable capacitors 1 and 3 of the series resonant circuit of FIG. 7, the parallel resonant frequency can be controlled in a wide range.

As the absolute value of the impedance Zs of the series resonant circuit, it is sufficient to replace the expression of "s" with the angular frequency ω or frequency "f" using s=j·ω=j·2πf in the equation 8 and obtain the absolute value in the case of the angular frequency ω or frequency "f". Therefore, the impedance Zs of the series resonant circuit becomes the minimum at the angular frequency (resonant angular frequency) of ωn shown in the equation 9. The minimum resonance impedance becomes a value obtained by substitution of s=j·ωn in the equation 8.

The series resonant circuit shown in FIG. 7 can be used as a band-rejection filter having an arbitrary resonant frequency in the extremely wide frequency band from about 2 GHz to about 14 GHz. Since the series resonant circuit has the minimum series resonance impedance at the resonant frequency, by setting the resonant frequency of the series resonant circuit at the frequency of an unwanted signal or harmonics signal, the unwanted signal or harmonics signal can be suppressed.

Series Resonant Circuit by Full-Differential Transconductance Circuit

Figure 8:
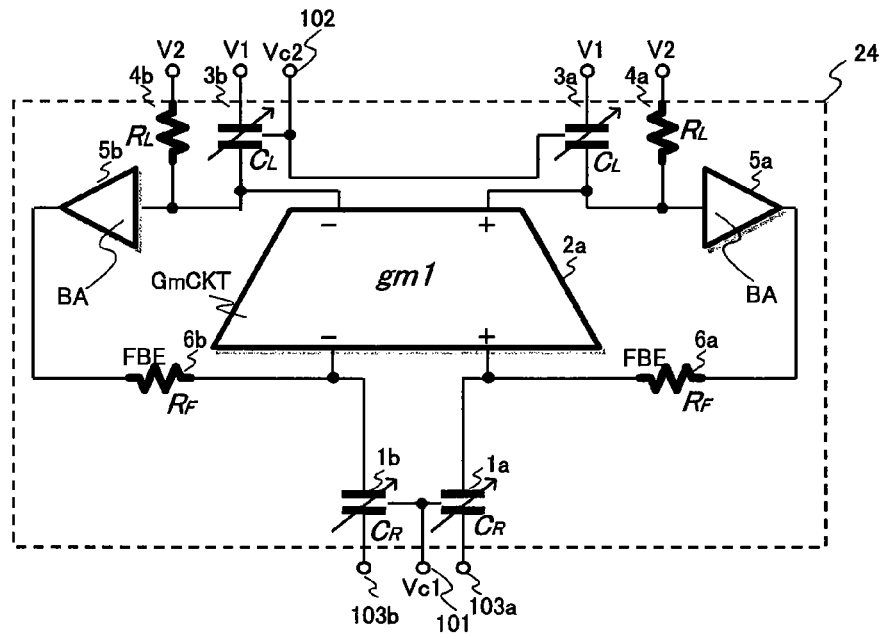
FIG. 8 is a diagram showing the configuration of a series-resonant circuit formed on a semiconductor chip of a semiconductor integrated circuit as another embodiment of the invention.

FIG. 8 is a diagram showing the configuration of a series resonant circuit formed on a semiconductor chip of a semiconductor integrated circuit as another embodiment of the invention. The series resonant circuit shown in FIG. 8 employs a configuration for a differential signal. The series resonant circuit shown in FIG. 8 has the pair of variable capacitors 1a and 1b, the differential transconductance circuit 2a having the non-inversion input terminal +, the inversion input terminal −, the non-inversion output terminal +, and the inversion output terminal −, the pair of variable capacitors 3a and 3b, the pair of resistors 4a and 4b, the pair of buffer circuits 5a and 5b, and the pair of feedback resistors 6a and 6b. The capacitance of the pair of variable capacitors 1a and 1b is variably controlled by the control voltage Vc1 applied to the control terminal 101. The differential transconductance circuit 2a generates non-inversion output current and inversion output current responding to input voltage across the non-inversion input terminal + and the inversion input terminal − at the non-inversion output terminal + and the non-inversion output terminal −, respectively. The capacitance of the pair of variable capacitors 3a and 3b is variably controlled by the control voltage Vc2 applied to the control terminal 102.

Therefore, the series resonant circuit shown in FIG. 8 is a full-differential series resonant circuit obtained by developing the series resonant circuit in the form of the single-end circuit shown in FIG. 7 to the full-differential transconductance circuit. As a result, the full-differential series resonant circuit shown in FIG. 8 can be used as a band rejection filter having arbitrary resonant frequency in the extremely wide frequency band of about 2 GHz to about 14 GHz in a manner similar to the series resonant circuit shown in FIG. 7. Further, the full-differential series resonance circuit shown in FIG. 8 has high common-mode rejection ratio (CMRR) to common-mode input signals supplied to the pair of signal terminals 103a and 103b.

Implementation of Parallel Resonant Circuit by Bipolar Transistors

FIG. 9 is a diagram showing a parallel resonant circuit comprised of bipolar transistors formed on a semiconductor chip of a semiconductor integrated circuit as another embodiment of the invention. In FIG. 9, the transconductance circuit 2 is formed by an NPN-type bipolar transistor Qgm whose emitter is connected to an AC grounding potential via an emitter resistor $R_E$ and the emitter resistor $R_E$, and the buffer circuit 5 is comprised of an NPN-type bipolar transistor $Q_{BA}$ and constant current source ICS.

The base and emitter of the NPN-type bipolar transistor Qgm function as the non-inversion input terminal and the inversion input terminal of the transconductance circuit 2, respectively. On the other hand, the collector current of the NPN-type bipolar transistor Qgm becomes an output current of the transconductance circuit 2. The buffer circuit 5 includes the NPN-type bipolar transistor $Q_{BA}$ operating as an emitter follower and a constant current source Ics.

To make the parallel resonant circuit using the bipolar transistors of FIG. 9 operate excellently, the bias voltage V3 at a proper level has to be supplied. A bias current necessary to make the NPN-type bipolar transistor Qgm of the transconductance circuit 2 operate in a target RF range is set as $Ic_{Qgm}$, and a bias current necessary to make the NPN-type bipolar transistor $Q_{BA}$ of the buffer circuit 5 operate in the target RF range is set as $Ic_{QBA}$. When it is assumed that the parallel resonant circuit supplies a bias current Ibias to a circuit at the stage before the transistors, a direct current bias voltage V3 can be expressed by the following equation 12.

Equation 12

$$V3 = Ic_{Qgm} \cdot R_L + V_{BEQBA} + Ibias \cdot R_F + V_{BEQgm} + Ic_{Qgm} \cdot R_E \quad (12)$$

The first term on the right side of the equation 12 denotes a voltage drop caused by the collector current $Ic_{Qgm}$ of the NPN-type bipolar transistor Qgm of the resistor 4 ($R_L$). The second term denotes base-emitter voltage of the NPN-type bipolar transistor $Q_{BA}$ of the buffer circuit 5. The third term denotes a voltage drop caused by the bias current Ibias of the feedback resistor 6 ($R_F$). The fourth term denotes base-emitter voltage of the NPN-type bipolar transistor Qgm. The fifth term denotes a voltage drop caused by the current $Ic_{Qgm}$ of the NPN-type bipolar transistor Qgm of the emitter resistor $R_E$.

For example, in the case where the collector current $Ic_{Qgm}=0.5$ mA, the base-emitter voltage $V_{Qgm}$ and $V_{QBA}=0.95V$, $R_L=1$ KΩ, $R_F=300Ω$, $R_E=100Ω$, and Ibias=1 mA, the proper voltage level of the bias voltage V3 is 2.75V or higher.

Figure 10:
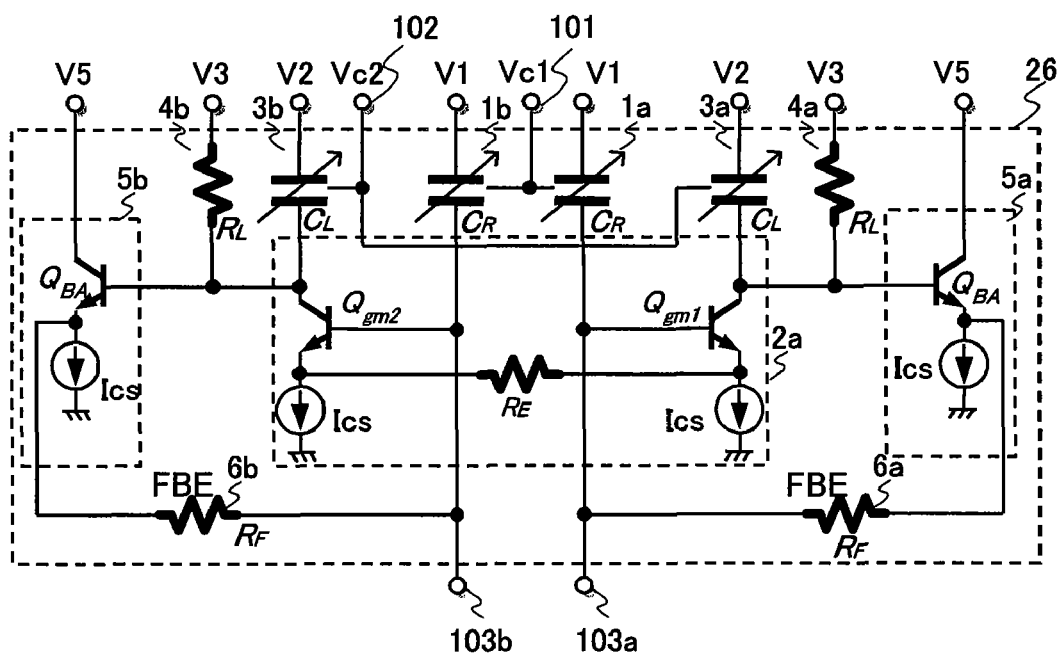
FIG. 10 is a diagram showing a resonant circuit comprised of a bipolar transistor and formed on the semiconductor chip of the semiconductor integrated circuit as the another embodiment of the invention of FIG. 6.

Implementation of Full-Differential Parallel Resonant Circuit by Bipolar Transistors FIG. 10 is a diagram showing a resonant circuit comprised of bipolar transistors formed on a semiconductor chip of a semiconductor integrated circuit as another embodiment of the invention of FIG. 6. In FIG. 10, the transconductance circuit 2a is formed by a pair of NPN-type bipolar transistors Qgm1 and Qgm2, the emitter resistor $R_E$, and a pair of constant current sources Ics. Each of the pair of buffer circuits 5a and 5b is comprised of the NPN-type bipolar transistor $Q_{BA}$ and the constant current source Ics.

To make the full-differential parallel resonant circuit using the bipolar transistors of FIG. 10 operate excellently, the bias voltage V3 at a proper level has to be supplied. A bias current necessary to make the NPN-type bipolar transistors Qgm1 and Qgm2 of the transconductance circuit 2a operate in a target RF range is set as $Ic_{Qgm}$, and a bias current necessary to make the NPN-type bipolar transistors $Q_{BA}$ of the buffer circuits 5a and 5b operate in the target RF range is set as $Ic_{QBA}$. When it is assumed that the parallel resonant circuit supplies a bias current Ibias to a circuit at the stage before the transistors, the direct current bias voltage V3 can be expressed by the following equation 13.

Equation 13

$$V3 = Ic_{Qgm} \cdot R_L + V_{BEQBA} + Ibias \cdot R_F + V_{BEQgm} + V_{CE(sat)} \quad (13)$$

The first term on the right side of the equation 13 denotes a voltage drop caused by the collector current $Ic_{Qgm}$ of the NPN-type bipolar transistor Qgm of the resistor 4 ($R_L$). The second term denotes base-emitter voltage of the NPN-type bipolar transistor $Q_{BA}$ of the buffer circuit 5. The third term denotes a voltage drop caused by the bias current Ibias of the feedback resistor 6 ($R_F$). The fourth term denotes base-emitter voltage of the NPN-type bipolar transistor Qgm. The fifth term denotes collector-emitter saturation voltage $V_{CE}$(sat) of the NPN-type bipolar constant current transistor of the constant current source Ics of the transconductance circuit 2a.

For example, in the case where the collector current $Ic_{Qgm}=0.5$ mA, the base-emitter voltage $V_{Qgm}$ and $V_{QBA}=0.95V$, $R_F=300Ω$, Ibias=1 mA, and $V_{CE}$(sat)=about 0.4V, the proper voltage level of the bias voltage V3 is 3.1V or higher.

Implementation of Parallel Resonant Circuit by MOS Transistors

FIG. 11 shows that NPN-type bipolar transistors in the transconductance circuit 2 and the buffer circuit 5 in the parallel resonant circuit formed on a semiconductor chip of a semiconductor integrated circuit as the embodiment of the invention shown in FIG. 9 are replaced with N-channel-type MOS field effect transistors.

In FIG. 11, the gate and source of the N-channel-type MOS transistor Mgm function as the non-inversion input terminal and the inversion input terminal of the transconductance circuit 2, respectively. On the other hand, the drain current of the N-channel-type MOS transistor Mgm becomes an output current of the transconductance circuit 2. The buffer circuit 5 includes the N-channel-type MOS transistor $M_{BA}$ operating as a source follower and a constant current source Ics.

To make the parallel resonant circuit using the N-channel-type MOS transistors of FIG. 11 operate excellently, the bias voltage V3 at a proper level has to be supplied. A bias current necessary to make the N-channel-type MOS transistor Mgm of the transconductance circuit 2 operate in a target RF range is set as $Id_{Mgm}$, and a bias current necessary to make the N-channel-type MOS transistor $M_{BA}$ of the buffer circuit 5 operate in the target RF range is set as $Id_{MBA}$. When it is assumed that the parallel resonant circuit supplies a bias current Ibias to a circuit at the stage before the transistors, the direct current bias voltage V3 can be expressed by the following equation 14.

Equation 14

$$V3 = Id_{Mgm} \cdot R_L + V_{GSMBA} + Ibias \cdot R_F + V_{GSMgm} + Id_{Mgm} \cdot R_E \quad (14)$$

The first term on the right side of the equation 14 denotes a voltage drop caused by the collector current $Id_{Mgm}$ of the N-channel-type MOS transistor Mgm of the resistor 4 ($R_L$). The second term denotes gate-source voltage of the N-channel-type MOS transistor $M_{BA}$ of the buffer circuit 5. The third term denotes a voltage drop caused by the bias current Ibias of the feedback resistor 6 ($R_F$). The fourth term denotes gate-source voltage of the N-channel-type MOS transistor Mgm. The fifth term denotes a voltage drop caused by the current $Id_{Mgm}$ of the N-channel-type MOS transistor Mgm of the source resistor $R_E$.

For example, in the case where the drain current $Id_{Mgm}=0.5$ mA, the gate-source voltage $V_{Mgm}$ and $V_{MBA}=0.5V$, $R_L=1$ KΩ, $R_F=100Ω$, and Ibias=1 mA, the proper voltage level of the bias voltage V3 is 1.85V or higher.

As described above, the transconductance circuit 2 and the buffer circuit 5 of the parallel resonant circuit shown in FIG. 9 use the NPN-type bipolar transistors with a large base-emitter voltage of 0.95V. In contrast, the transconductance circuit 2 and the buffer circuit 5 of the parallel resonant circuit shown in FIG. 11 use the N-channel-type MOS transistors with a small gate-source voltage of 0.5V. Therefore, the proper voltage 2.75V of the bias voltage V3 of the parallel resonant circuit of FIG. 9 can be largely reduced to the proper voltage 1.85V of the bias voltage V3 of the parallel resonant circuit of FIG. 11.

Figure 12:
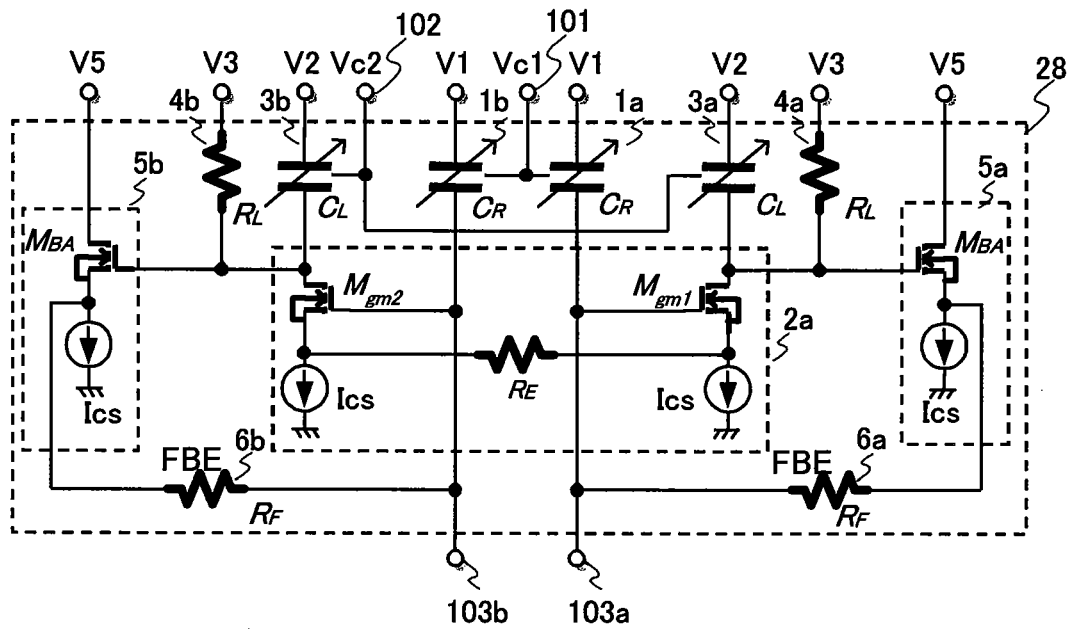
FIG. 12 is a diagram showing the case where NPN-type bipolar transistors in the transconductance circuit and a buffer circuit of the full-differential parallel-resonant circuit formed on the semiconductor chip of the semiconductor integrated circuit as the embodiment of the invention illustrated in FIG. 10 are replaced with N-channel-type MOS field effect transistors.

Implementation of Full-Differential Parallel Resonant Circuit by MOS Transistors FIG. 12 shows that NPN-type bipolar transistors in the transconductance circuit 2a and the buffer circuits 5a and 5b in the full-differential parallel resonant circuit formed on a semiconductor chip of a semiconductor integrated circuit as the embodiment of the invention shown in FIG. 10 are replaced with N-channel-type MOS transistors.

In FIG. 12, the transconductance circuit 2a is formed by a pair of N-channel-type MOS transistors Mgm1 and Mgm2, the source resistor $R_E$, and a pair of constant current sources Ics. Each of the pair of buffer circuits 5a and 5b is comprised of the N-channel-type MOS transistor $M_{BA}$ and the constant current source Ics.

To make the full-differential parallel resonant circuit using the MOS transistors of FIG. 12 operate excellently, the bias voltage V3 at a proper level has to be supplied. A bias current necessary to make the N-channel-type MOS transistors Mgm1 and Mgm2 of the transconductance circuit 2a operate in a target RF range is set as $Id_{Mgm}$, and a bias current necessary to make the N-channel-type MOS transistors $M_{BA}$ of the buffer circuits 5a and 5b operate in the target RF range is set as $Id_{MBA}$. When it is assumed that the parallel resonant circuit supplies a bias current Ibias to a circuit at the stage before the transistors, the direct current bias voltage V3 can be expressed by the following equation 15.

Equation 15

$$V3 = Id_{Mgm} \cdot R_L + V_{GSMBA} + Ibias \cdot R_F + V_{GSMgm} + V_{DS(sat)} \quad (15)$$

The first term on the right side of the equation 15 denotes a voltage drop caused by the drain current $Id_{Mgm}$ of the N-channel-type MOS transistor Mgm of the resistor 4 ($R_L$). The second term denotes gate-source voltage of the N-channel-type MOS transistor $M_{BA}$ of the buffer circuits 5a and 5b. The third term denotes a voltage drop caused by the bias current Ibias of the feedback resistor 6 ($R_F$). The fourth term denotes gate-source voltage of the N-channel-type MOS transistor Mgm. The fifth term denotes drain-source saturation voltage $V_{CE}$ (sat) of the N-channel-type MOS transistor of the constant current source Ics of the transconductance circuit 2a.

For example, in the case where the drain current $Id_{Mgm}$=0.5 mA, the gate-source voltage $V_{Mgm}$ and $V_{MBA}$=0.5V, $R_L$=1 KΩ, $R_F$=300Ω, Ibias=1 mA, and $V_{DS}$ (sat)=about 0.4V, the proper voltage level of the bias voltage V3 is 2.2V or higher.

As described above, the transconductance circuit 2a and the buffer circuits 5a and 5b of the full-differential parallel resonant circuit shown in FIG. 10 use the NPN-type bipolar transistors with a large base-emitter voltage of 0.95V. In contrast, the transconductance circuit 2a and the buffer circuits 5a and 5b of the full differential parallel resonant circuit shown in FIG. 12 use the N-channel-type MOS transistors with a small gate-source voltage of 0.5V. Therefore, the proper voltage 3.1V of the bias voltage V3 of the full differential parallel resonant circuit of FIG. 10 can be largely reduced to the proper voltage 2.2V of the bias voltage V3 of the full differential parallel resonant circuit of FIG. 12.

Parallel Resonant Circuit by Another Full-Differential Transconductance Circuit

Figure 13:
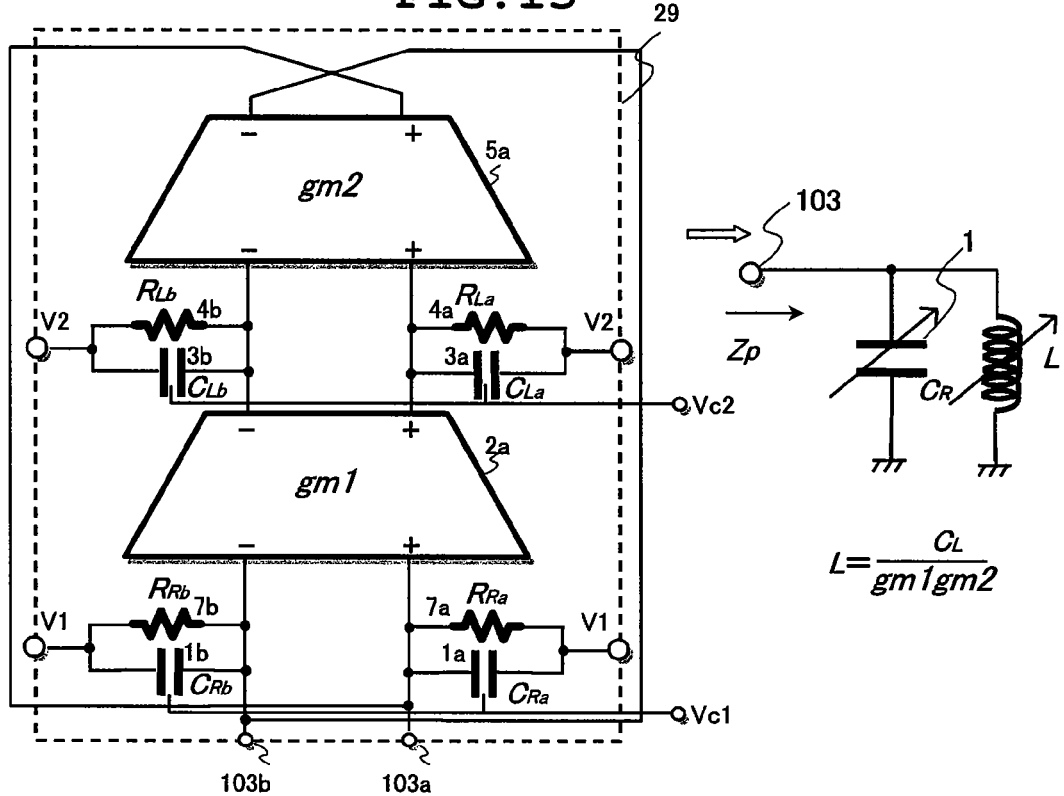
FIG. 13 is a diagram showing a parallel-resonant circuit formed by a full-differential transconductance circuit formed on the semiconductor chip of the semiconductor integrated circuit as another embodiment of the invention.

FIG. 13 is a diagram showing a parallel resonance circuit using a full-differential transconductance circuit formed on a semiconductor chip of a semiconductor integrated circuit as another embodiment of the invention. It is compared with the parallel resonant circuit using the full-differential transconductance circuit shown in FIG. 6. In the circuit of FIG. 13, the circuit 5a in the second stage is not the buffer circuits 5a and 5b having the value of the voltage gain A1 is 1 as shown in FIG. 6 but is a transconductance circuit like the circuit 2a in the first stage. As a result, the feedback resistor 6 as shown in FIG. 6 is not used for the full-differential parallel resonant circuit of FIG. 13.

The full-differential parallel resonant circuit shown in FIG. 13 has a pair of variable capacitors 1a and 1b, a pair of resistors 7a and 7b, a differential transconductance circuit 2a having a non-inversion input terminal +, an inversion input terminal −, a non-inversion output terminal +, and an inversion output terminal −, a pair of variable capacitors 3a and 3b, a pair of resistors 4a and 4b, and a differential transconductance circuit 5a having a non-inversion input terminal +, an inversion input terminal −, a non-inversion output terminal +, and an inversion output terminal −. The capacitance of the pair of variable capacitors 1a and 1b is variably controlled by the control voltage Vc1 applied to the control terminal 101. The differential transconductance circuit 2a generates non-inversion output current and inversion output current responding to input voltage across the non-inversion input terminal + and the inversion input terminal − at the non-inversion output terminal + and the inversion output terminal −, respectively. The capacitance of the pair of variable capacitors 3a and 3b is variably controlled by the control voltage Vc2 applied to the control terminal 102. The differential transconductance circuit 5a in the second stage also passes non-inversion output current and inversion output current responding to input voltage across the non-inversion input terminal + and the inversion input terminal − to the pair of variable capacitors 1a and 1b and the pair of resistors 7a and 7b.

The function of the feedback resistor 6 in FIG. 6 is executed by the transconductance circuit 5a in the second stage in FIG. 13. Therefore, when the conductance of the differential transconductance circuit 5a in the second stage is gm2, the equivalent inductance L at the signal terminals 103a and 103b is given by the following equation.

Equation 16

$$L = \frac{C_L}{gm1 \, gm2} \quad (16)$$

When the capacitances $C_{La}$ and $C_{Lb}$ of the variable capacitors 3a and 3b are increased by the control voltage Vc2 applied to the control terminal 102, the equivalent inductance L increases, and the parallel resonant frequency can be lowered. On the contrary, when the capacitances $C_{La}$ and $C_{Lb}$ of the variable capacitors 3a and 3b are decreased by the control voltage Vc2 applied to the control terminal 102, the equivalent inductance L decreases, and the parallel resonant frequency can be increased.

Further, by increasing the capacitances $C_R$a and $C_R$b of the variable capacitors 1a and 1b connected in parallel with the equivalent inductor L by the control voltage Vc1 applied to the control terminal 101, the parallel resonant frequency can be lowered. On the contrary, by decreasing the capacitances $C_Ra$ and $C_Rb$ of the variable capacitors 1*a* and 1*b* by the control voltage Vc1 applied to the control terminal 101, the parallel resonant frequency can be increased. In such a manner, by properly changing the capacitances $C_Ra$ and $C_Rb$ and $C_{La}$ and $C_{Lb}$ of the four variable capacitors 1*a*, 1*b*, 3*a*, and 3*b* of the parallel resonant circuit of FIG. 13, the parallel resonant frequency can be controlled in a wide range.

Implementation of Another Parallel Resonant Circuit Using CMOS Transistors

Figure 14:
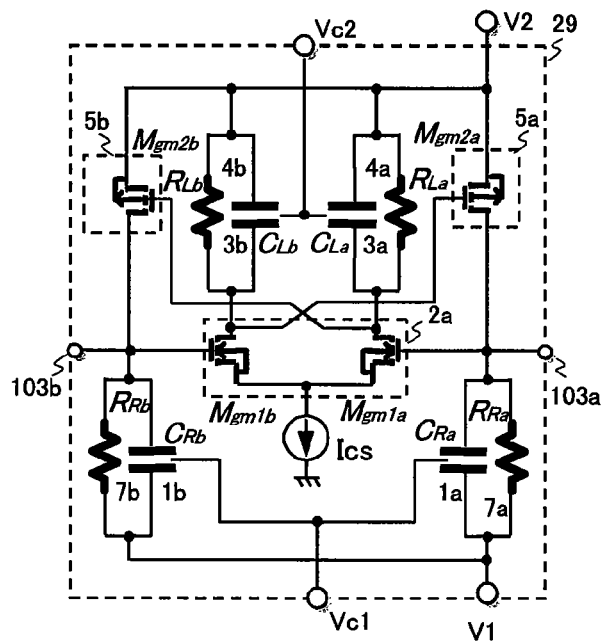
FIG. 14 is a diagram showing the case where the full-differential transconductance circuit formed on the semiconductor chip of the semiconductor integrated circuit as another embodiment of the invention of FIG. 13 is comprised of a CMOS transistor.

FIG. 14 shows that the full-differential transconductance circuit formed on the semiconductor chip of the semiconductor integrated circuit as another embodiment of the invention of FIG. 13 is comprised of CMOS transistors. In FIG. 14, the differential transconductance circuit 2*a* in the first stage is formed by a pair of N-channel MOS transistors Mgm1*a* and Mgm1*b* and a constant current source Ics. The differential transconductance circuits 5*a*, 5*b* of the second stage are comprised of a pair of P-channel MOS transistors Mgm2*a* and Mgm2*b*. Parallel connection of the variable capacitors 3*a* and 3*b* and the resistors 4*a* and 4*b* is a load at drain nodes of the N-channel MOS transistors Mgm1*a* and Mgm1*b* of the differential transconductance circuit 2*a* in the first stage. Parallel connection of the variable capacitors 1*a* and 1*b* and the resistors 7*a* and 7*b* is a load at drain nodes of the P-channel MOS transistors Mgm2*a* and Mgm2*b* of the differential transconductance circuits 5*a* and 5*b* in the second stage. The voltage V1 can be set to the level of the ground voltage to which the current source Ics is connected.

The basic configuration of the parallel resonant circuit using the full-differential transconductance circuits of FIGS. 13 and 14 is similar to the combination of the gyrator and the capacitor described in the non-patent document 4.

Implementation of Parallel Resonant Circuit Using Variable Capacitors

The capacitances $C_R$ and $C_L$ of the variable capacitors 1 and 3 in any of the parallel resonant circuits and series resonant circuits in the foregoing various embodiments are variably controlled by the control voltages Vc1 and Vc2 applied to the control terminals 101 and 102. The control voltages Vc1 and Vc2 may take the form of digital or analog signals.

Figure 2:
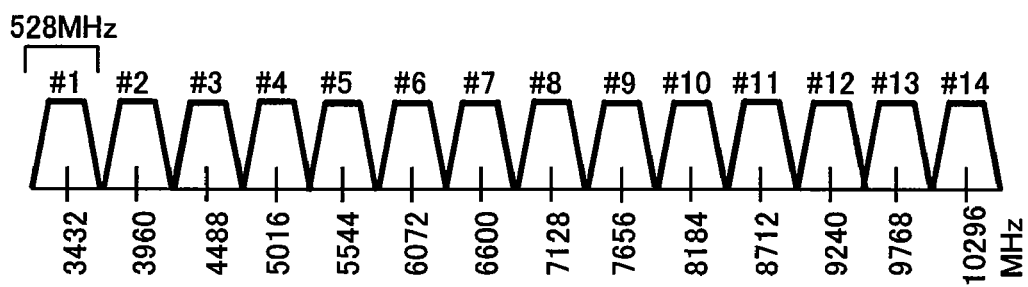
FIG. 2 is a diagram showing frequency arrangement for UWB wireless communication employing the MB-OFDM system.

A sub-band to be used is determined from the first sub-band using the RF of 3,432 MHz for the UWB wireless communication in the MB-OFDM system shown in FIG. 2 as a center frequency to the fourteenth sub-band using 10,296 MHz as a center frequency by a sub-band selection signal made of a plurality of bits. By on-off controlling a plurality of switches with the sub-band selection signal of the bits, the capacitances $C_R$ and $C_L$ of the variable capacitors 1 and 3 can be coarsely tuned. Further, by applying a high-precision analog tuning voltage to a variable capacitor in a variable-capacitance diode or the like in the selected sub-band, fine tuning can be also performed.

Figure 15:
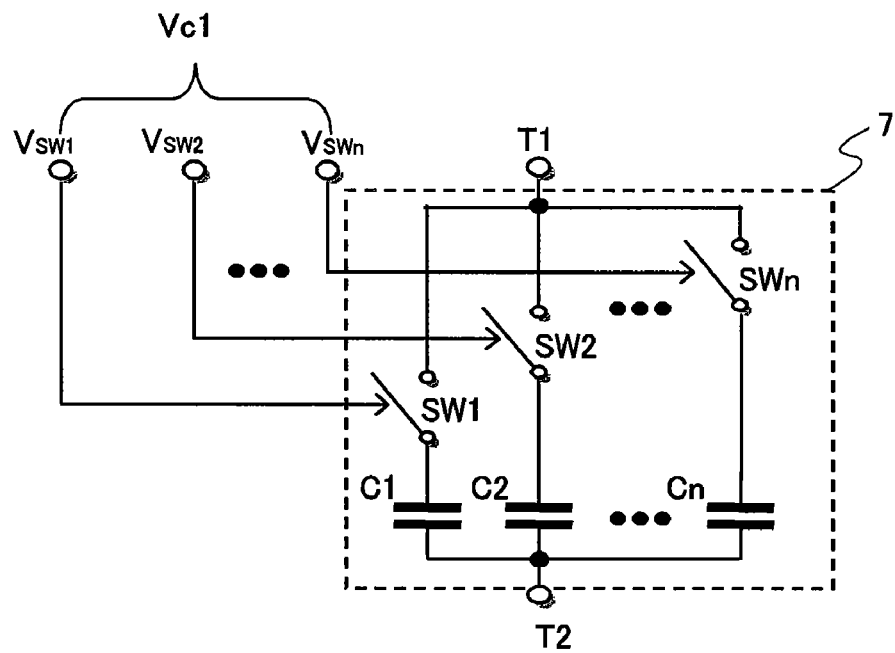
FIG. 15 is a diagram showing a configuration example of a variable capacitor which can be used for a single-end or full-differential parallel-resonant circuit or series-resonant circuit in the various embodiments.

FIG. 15 is a diagram showing a configuration example of the variable capacitors 1 and 3 which can be used for the single-end or full-differential parallel resonant circuit or series resonant circuit in any of the various embodiments.

A variable capacitor 7 shown in FIG. 15 includes a plurality of capacitors C1, C2, . . . , and Cn and a plurality of switches SW1, SW2, . . . , and SWn. A plurality of series-connections each of a capacitor and a switch are connected in parallel between terminals T1 and T2. The switches SW1, SW2, . . . , and SWn can be on/off controlled by a plurality of control voltages $V_{SW1}$, $V_{SW2}$, . . . , and $V_{SWn}$ as selection signals each made of a plurality of bits. The switches SW1, SW2, . . . , and SWn may be MOS switches.

By turning on/off the switches SW1, SW2, . . . , and SWn with the control voltages $V_{SW1}$, $V_{SW2}$, . . . , and $V_{SWn}$ the value of total capacitance between the terminals T1 and T2 can be variably controlled. The capacitances of the capacitors C1, C2, . . . , and Cn are set to be equal to each other. In another embodiment, the capacitances of the capacitors C1, C2, . . . , and Cn are set as weighted different values.

Figure 16:
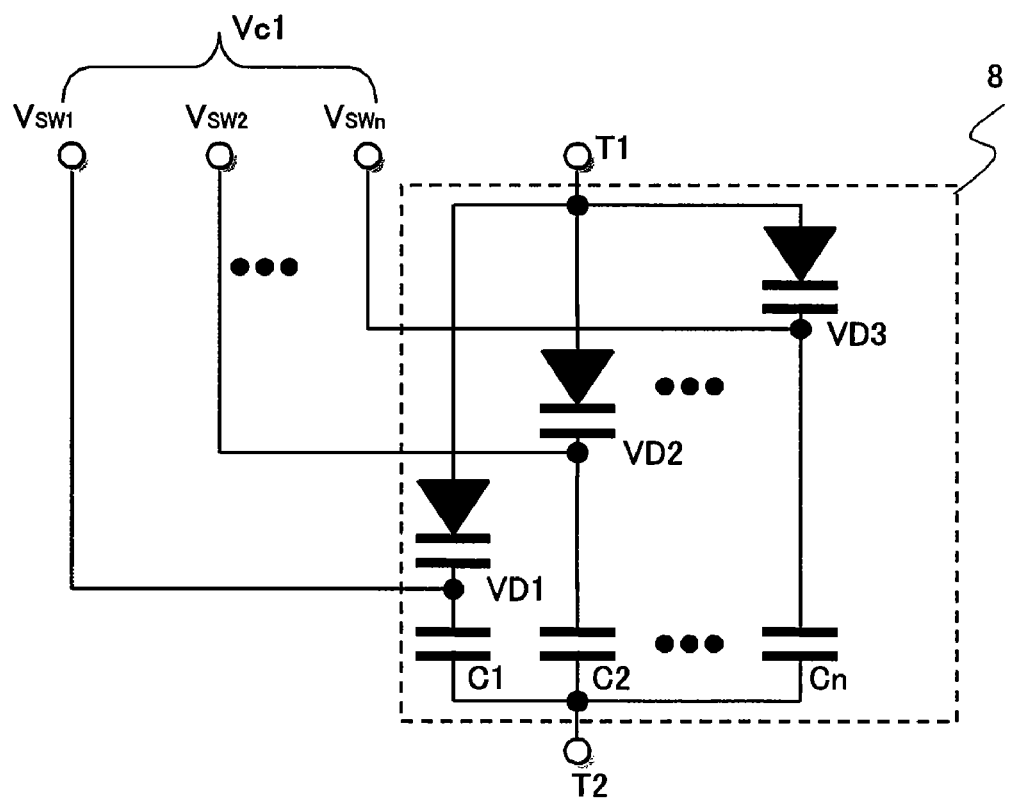
FIG. 16 is a diagram showing another configuration example of a variable capacitor which can be used for a single-end or full-differential parallel-resonant circuit or series-resonant circuit in the various embodiments.

FIG. 16 is a diagram also showing another configuration example of the variable capacitors 1 and 3 which can be used for the single-end or full-differential parallel resonant circuit or series resonant circuit in any of the various embodiments.

In FIG. 16, the switches SW1, SW2, . . . , and SWn in FIG. 15 are replaced with variable capacitors VD1, VD2, . . . , and VDn of variable capacitance diodes (varactor diodes). A varactor diode element is realized by various methods such as an element using the gate structure of a MOS transistor, an element using pn-junction formed in a process of manufacturing a bipolar transistor, or the like. Generally, the varactor diode is finely tuned by application of a high-precision analog tuning voltage. In the example of FIG. 16, by a plurality of control voltages $V_{SW1}$, $V_{SW2}$, . . . , and $V_{SWn1}$, the variable capacitors VD1, VD2, . . . , and VDn are controlled to have an extremely large capacitance and an extremely small capacitance. As a result, the variable capacitors VD1, VD2, . . . , and VDn have a function equivalent to that of switches.

RF Low-Noise Amplifier Having Parallel Resonant Circuit and Series Resonant Circuit FIG. 17 is a diagram showing an RF low-noise amplifier LNA formed on a semiconductor chip of a semiconductor integrated circuit as another embodiment of the invention. The RF low-noise amplifier LNA includes a common-emitter NPN-type RF amplifier transistor Q1 and a common-base NPN-type output transistor Q2. The RF amplifier transistor Q1 and the output transistor Q2 are biased by NPN-type bias transistors Q3 and Q4 connected in series between power source voltage Vcc and the ground. A base resistor R is connected to each of the transistors Q1, Q3, and Q4. Capacitances $C_{B1}$ and $C_{B2}$ suppress ripple components included in a base bias voltage. A signal terminal RFin is used as an input terminal of the RF low-noise amplifier LNA, and the signal terminal 103 is used as an output terminal.

To the base of the RF amplifier transistor Q1, an RF input signal RFin in an arbitrary sub-band selected from the first sub-band using 3,432 MHz as the RF for the UWB wireless communication in the MB-OFDM system shown in FIG. 2 to the fourteenth sub-band using 10,296 MHz as a center frequency is supplied via a coupling capacitance $C_{IN}$. An RF amplifier signal of the collector of the RF amplifier transistor Q1 is supplied to a parallel resonant circuit 21 via an emitter-collector path of the common-base output transistor Q2. In the parallel resonant circuit 21 of FIG. 17, the power source voltage Vcc is supplied to the two variable capacitors 1 and 3, the resistor 4, and the buffer circuit 5. The parallel resonant circuit 21 of FIG. 17 operates as an active load on the RF low-noise amplifier LNA. The active load is formed by parallel connection of the equivalent inductor L between the collector of the common-base output transistor Q2 and the power source voltage Vcc and the capacitance $C_R$ of the variable capacitor 1.

In the parallel resonant circuit 21 in FIG. 17, as described by referring to FIG. 1, by properly changing the capacitances $C_R$ and $C_L$ of the two variable capacitors 1 and 3 of the parallel resonant circuit 21, the parallel resonant frequency at which the maximum parallel resonance impedance is generated can be controlled in a wide frequency band. According to a sub-band selected from the first sub-band of the RF for the UWB wireless communication of the MB-OFDM system to the fourteenth sub-band, the capacitances $C_R$ and $C_L$ of the two variable capacitors 1 and 3 are properly set. Since the LC parallel resonant circuit 21 of the collector of the common-base output transistor Q2 shows the maximum parallel resonance impedance in a wide frequency band, the RF low-noise amplifier LNA in FIG. 17 can amplify the RF input signal RFin of a desired frequency with high gain.

To the base of the RF amplifier transistor Q1 of the RF low-noise amplifier LNA, an unwanted signal component is also supplied. Desirably, the RF low-noise amplifier LNA amplifies the gain for the unwanted signal low. A series resonant circuit 23 connected between the collector of the RF amplifier transistor Q1 and the emitter of the common-base output transistor Q2 functions as an active notch filter that suppresses the level of the unwanted signal. In the series resonant circuit 23 in FIG. 17, the power source voltage Vcc is supplied to the two variable capacitors 1 and 3, the resistor 4, and the buffer circuit 5. The series resonant circuit 23 in FIG. 17 operates as an active notch filter of the RF low-noise amplifier LNA. The active notch filter is formed by serial connection of the equivalent inductor L between the collector of the common-base output transistor Q2 and the power source voltage Vcc and the capacitance $C_R$ of the variable capacitor 1.

The series resonant circuit 23 in FIG. 17 can arbitrary control a series resonant frequency at which the minimum series resonance impedance is generated in a wide frequency band by properly changing the capacitances $C_R$ and $C_L$ of the two variable capacitors 1 and 3 in the series resonant circuit 23 as described with reference to FIG. 7. According to the unwanted signal or harmonics signal to be suppressed, the values of the capacitances $C_R$ and $C_L$ of the two variable capacitors 1 and 3 are properly set. The power source voltage Vcc is AC grounding potential. A signal to be suppressed is bypassed from the collector of the RF amplifier transistor Q1 to the AC grounding potential of the power source voltage Vcc via the set minimum series resonance impedance. Since the series resonance circuit 23 connected between the RF amplifier transistor Q1 and the common-base output transistor Q2 shows the minimum series resonance impedance in a wide frequency band, the RF low-noise amplifier LNA in FIG. 15 can suppress the level of undesired disturbing wave and harmonics.

Voltage Controlled Oscillator Having Parallel Resonant Circuit as Active Load

FIG. 18 is a diagram showing the configuration of a voltage controlled oscillator of a frequency synthesizer for generating a reception local signal to be supplied to a reception mixer and a transmission local signal to be supplied to a transmission mixer. The voltage controlled oscillator includes a pair of NMOS transistors QN1 and QN2 whose drains and gates are cross-coupled in positive feedback arrangement and the constant current source Ics. To the drains of the pair of oscillation NMOS transistors QN1 and QN2, the full-differential parallel resonant circuit 22 shown in FIG. 6 is connected as an active load. In the full-differential parallel resonant circuit 22 in FIG. 18, the power source voltage Vcc is supplied to four variable capacitors 1a, 1b, 3a, and 3b, resistors 4a and 4b, and buffer circuits 5a and 5b. The active load is configured by parallel connection of the equivalent inductor L between the drains of the oscillator NMOS transistors QN1 and QN2 and the power source voltage Vcc and the capacitance $C_R$ of the variable capacitor L. Output signal terminals are terminals 103a and 103b.

In the full-differential parallel resonant circuit 22 in FIG. 18, by properly changing the capacitances $C_R$a, $C_R$b, $C_L$a, and $C_L$b of the four variable capacitors 1a, 1b, 3a, and 3b as described by referring to FIG. 6, the parallel resonant frequency at which the maximum parallel resonance impedance is generated can be controlled arbitrarily in a wide frequency band. According to a local signal of a sub-band selected from the first sub-band of the RF for the UWB wireless communication of the MB-OFDM system to the fourteenth sub-band, the capacitances $C_R$ and $C_L$ of the four variable capacitors 1a, 1b, 3a, and 3b are properly set. Since the LC tank parallel resonant circuit 22 of the drains of the pair of NMOS transistors QN1 and QN2 shows the maximum parallel resonance impedance in a wide frequency band, the voltage controlled oscillator in FIG. 18 can oscillate stably.

Double-Balanced Mixer Having Parallel Resonant Circuit as Active Load

FIG. 19 is a diagram showing an SSB (Single Side Band) mixer comprised of two double-balanced mixers 10 formed on a semiconductor chip of a semiconductor integrated circuit as another embodiment of the present invention.

One of the two double-balanced mixers 10 is a modulator MOD(I) of a Gilbert cell form including six transistors Q1I, . . . , and Q6I, an emitter resistor $R_E$, and two constant current sources Ics. The other mixer is a modulator MOD(Q) of a Gilbert cell form including six transistors Q1Q, . . . , and Q6Q, an emitter resistor $R_E$, and two constant current sources Ics. To one of the mixers, an RF input signal $V_{RF\_}I$ and a local signal $V_{LO\_}I$ are supplied. To the other mixer, an RF input signal $V_{RF\_}Q$ and a local signal $V_{LO\_}Q$ are supplied. The output signal terminals are terminals 103a and 103b.

The characteristic of FIG. 19 is that the full-differential parallel resonant circuit 22 shown in FIG. 6 is used as a common active load of one modulator MOD(I) and the other modulator MOD(Q) of the double-balanced mixer 10. In the full-differential parallel resonant circuit 22 of FIG. 19, the power source voltage Vcc is supplied to the four variable capacitors 1a, 1b, 3a, and 3b, the resistors 4a and 4b, and the buffer circuits 5a and 5b. The active load is configured by parallel connection of the equivalent inductor L between the modulators MOD(I) and MOD(Q) of the double-balanced mixer 10 and the power source voltage Vcc and the capacitance $C_R$ of the variable capacitor 1. As a result, as shown in an equivalent circuit in a lower part of FIG. 19, an output signal of the modulator MOD(I) and an output signal of the other modulator MOD(Q) are vector-synthesized in the full-differential parallel resonant circuit 22, so that a differential modulation output signal Vout can be generated.

The full-differential parallel resonant circuit 22 as a common active load of the two double-balanced mixers 10 configuring the SSB mixer has the maximum resonance impedance at an arbitrary parallel resonance frequency in an extremely wide frequency band of about 2 GHz to about 14 GHz.

Evolved SSB Mixer

Figure 20:
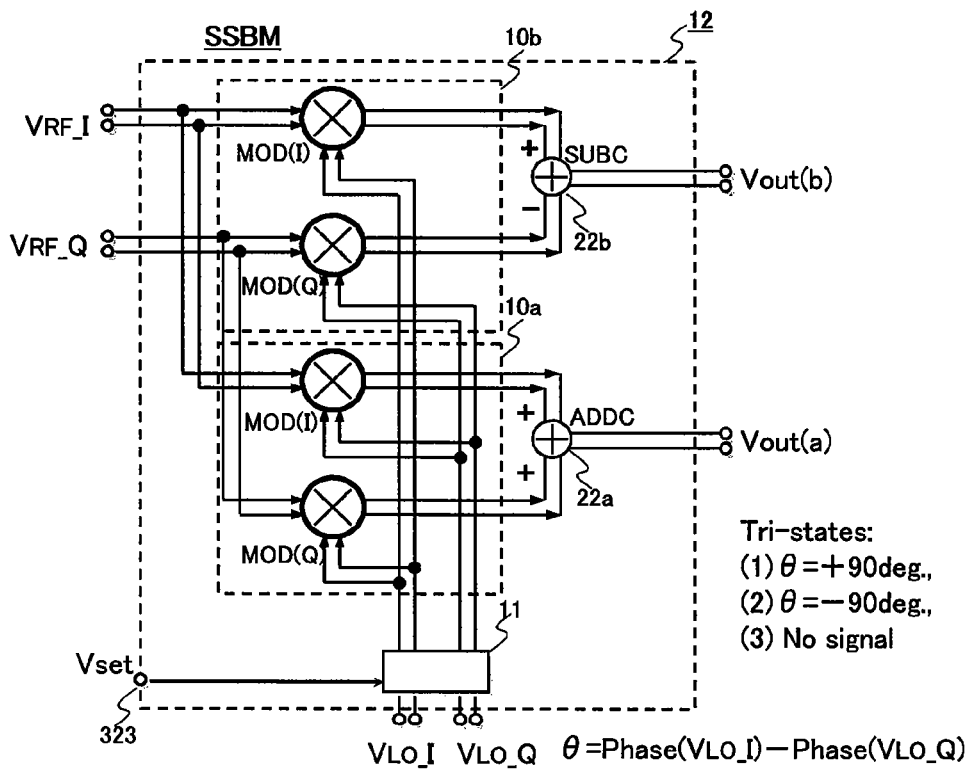
FIG. 20 is a diagram showing the configuration of an evolved SSB mixer using two mixers of FIG. 19.

FIG. 20 is a diagram showing the configuration of an evolved SSB mixer 12 using two mixers 10 of FIG. 19. The evolved SSB mixer shown in FIG. 20 uses two mixers 10a and 10b each similar to the mixer 10 of FIG. 18. In a full-differential parallel resonant circuit 22a as a common active load of the mixer 10a as one of the mixers, vector synthesis of analog addition of an output signal of the modulator MOD(I) and an output signal of the other modulator MOD(Q) is performed.

In a full-differential parallel resonant circuit 22b as a common active load of the other mixer 10b, vector synthesis of analog subtraction of an output signal of the modulator MOD(I) and an output signal of the other modulator MOD(Q) is performed.

To the two mixers 10a and 10b of the evolved SSB mixer 12, a tri-state buffer 11 to which local signals $V_{LO}\_I$ and $V_{LO}\_Q$ are supplied is connected. A control signal Vset of a frequency synthesizer is applied to a control terminal 323 of the tri-state buffer 11. Local output signals supplied from the tri-state buffer 11 to the two mixers 10a and 10b have three operation modes of a phase difference of +90 degrees, a phase difference of −90 degrees, and a DC voltage. As a result, output signals Vout(a) and Vout(b) having various frequencies can be generated from the full-differential parallel resonance circuits 22a and 22b as active loads of the two mixers 10a and 10b of the evolved SSB mixer 12 of the frequency synthesizer.

Frequency Synthesizer Using Evolved SSB Mixer

Figure 21:
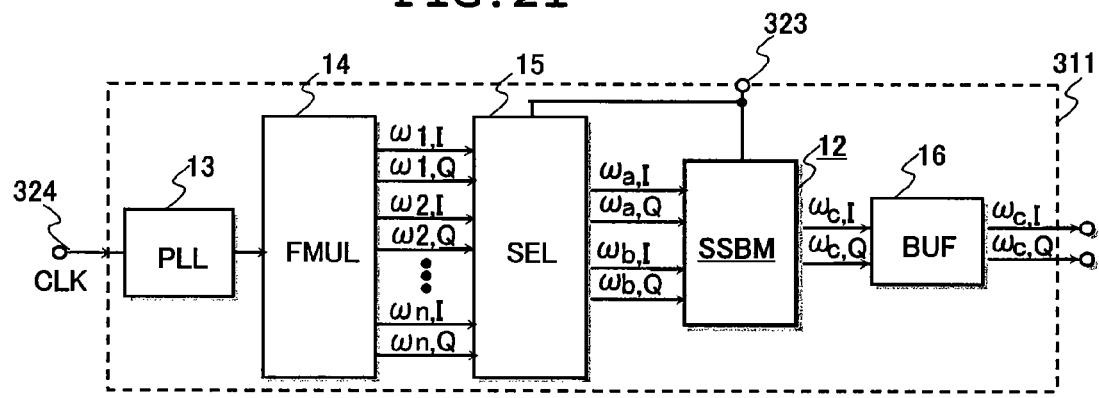
FIG. 21 is a diagram showing the configuration of a frequency synthesizer using an evolved SSB mixer 12 illustrated in FIG. 20.

FIG. 21 is a diagram showing the configuration of a frequency synthesizer 311 using the evolved SSB mixer 12 shown in FIG. 20. The frequency synthesizer 311 of FIG. 21 includes a PLL block 13, a multifrequency generation block 14, a selector 15, the evolved SSB mixer 12 shown in FIG. 20, and an output buffer 16. The PLL block 13 generates a high frequency signal on the basis of a reference clock signal CLK of an input terminal 324. The multifrequency generation block 14 generates frequency signals ω1, ω2, . . . , and ωn of an extremely large number of kinds by mixing a result of frequency division of high frequency signal from the PLL block 13 and a result of frequency multiplication. In response to the control signal of the control terminal 323, the selector 15 selects two pairs of in-phase and quadrature signals ωa(I/Q) and ωb(I/Q) from frequency signals ω1, ω2, . . . , and ωn of a large number of kinds of the multifrequency generation block 14 and supplies the selected signals to the evolved SSB mixer 12. The evolved SSB mixer 12 executes complicated mixing operation in response to the control signal of the control terminal 323 as described by referring to FIG. 19. A frequency synthesizer output signal ωc(I/Q) generated by the mixing operation of the evolved SSB mixer 12 is generated from the output buffer 16.

In such a manner, an RF signal of an arbitrary sub-band from the first sub-band using 3,432 MHz of an RF frequency for the UWB wireless communication in the MB-OFDM system shown in FIG. 2 as a center frequency to the fourteenth sub-band using 10,296 MHz as a center frequency can be generated from the output buffer 16 in the frequency synthesizer 311 of FIG. 21.

In a manner similar to the non-patent document 1, the conventional frequency synthesizer uses a number of spiral inductors and needs a large chip area. However, the frequency synthesizer 311 shown in FIG. 21 uses the full-differential parallel resonant circuit as an active load based on the evolved SSB mixer 12 shown in FIG. 20 and the SSB mixer shown in FIG. 19, so that the chip occupancy area can be reduced.

Down-Conversion Receiver

Figure 22:
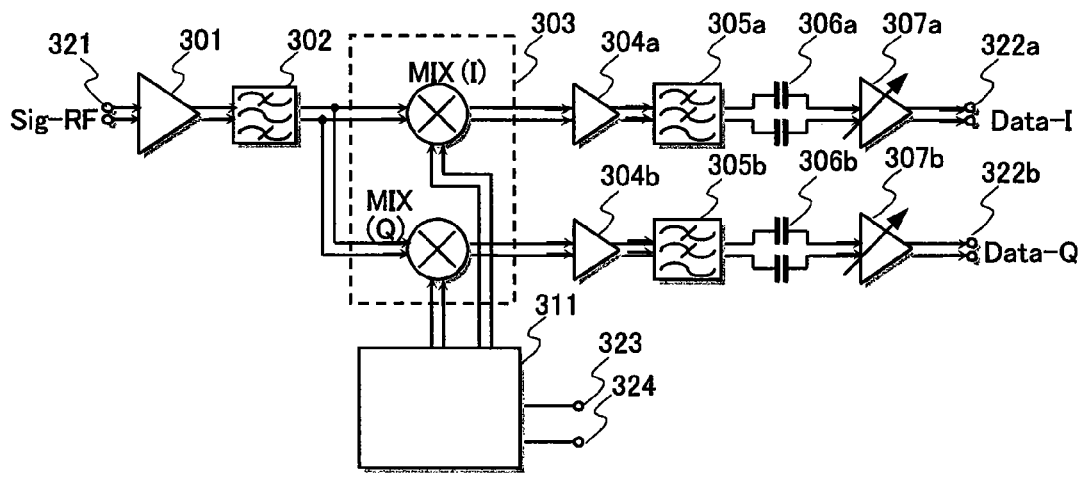
FIG. 22 is a diagram showing the configuration of a down-conversion receiver capable of receiving an RF signal in an arbitrary sub-band from the first to fourteenth sub-bands of the RF frequencies for the UWB wireless communication of the MB-OFDM system illustrated in FIG. 2.

FIG. 22 is a diagram showing the configuration of a down-conversion receiver capable of receiving an RF signal of an arbitrary sub-band from the first sub-band using 3,432 MHz of an RF frequency for the UWB wireless communication in the MB-OFDM system shown in FIG. 2 as a center frequency to the fourteenth sub-band using 10,296 MHz as a center frequency.

The down-conversion receiver includes a low-noise amplifier 301 for amplifying an RF signal Sig-RF in an arbitrary sub-band entered from an RF input terminal 321, a bandpass filter 302 for eliminating unnecessary waves in an output signal of the low-noise amplifier 301, and a direct down-conversion mixer 303 for converting an output signal of the bandpass filter 302 to a baseband frequency signal.

As the low-noise amplifier 301 of FIG. 22, an RF low-noise amplifier LNA having the parallel resonant circuit 21 as an active load as shown in FIG. 17 can be used. Further, as the low-noise amplifier 301 of FIG. 21, an RF low-noise amplifier LNA having the series resonant circuit 23 as an active notch filter as shown in FIG. 17 can be used. As the direct down-conversion mixer 303 in FIG. 22, the double-balanced mixer 10 having the full-differential parallel resonant circuit 22 as an active load can be used.

In the down-conversion receiver shown in FIG. 22, a reception local signal generated by the local signal generator 311 is supplied to the direct down-conversion mixer 303. As a voltage controlled oscillator of the frequency synthesizer of the local signal generator 311 for generating the reception local signal, a voltage controlled oscillator having the parallel resonant circuit 22 as an active load shown in FIG. 18 can be used. Further, as the local signal generator 311 in FIG. 22, a frequency synthesizer similar to the frequency synthesizer 311 shown in FIG. 21 can be also used.

An I/Q baseband reception signal generated from an output of the direct down-conversion mixer 303 is amplified by amplifiers 304a and 304b. After that, unwanted waves such as disturbing waves in the amplified signal are eliminated by low-pass filters 305a and 305b. The resultant signal passes through coupling capacitors 306a and 306b and is amplified again by programmable gain amplifiers 307a and 307b. An I/Q analog baseband reception signal as an output of the programmable gain amplifiers 307a and 307b is converted by an A/D converter to an I/Q digital baseband reception signal. The I/Q digital baseband reception signal is supplied to a not-shown baseband processor via a digital interface.

Up-Conversion Transmitter

Figure 23:
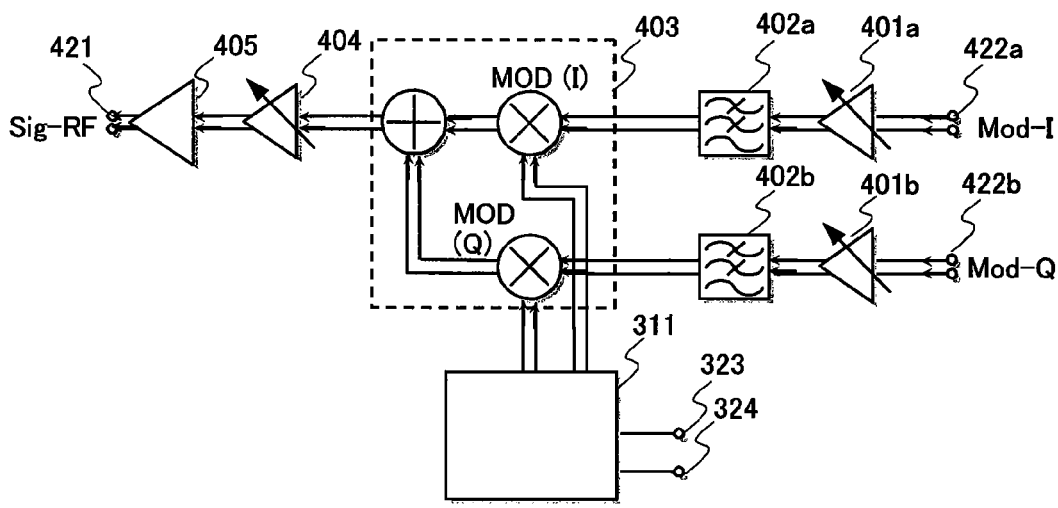
FIG. 23 is a diagram showing the configuration of an up-conversion transmitter capable of transmitting an RF signal in an arbitrary sub-band from the first to fourteenth sub-bands of the RF frequencies for the UWB wireless communication of the MB-OFDM system illustrated in FIG. 2.

FIG. 23 is a diagram showing the configuration of an up-conversion transmitter capable of transmitting an RF signal of an arbitrary sub-band from the first sub-band using 3,432 MHz of an RF frequency for the UWB wireless communication in the MB-OFDM system shown in FIG. 2 as a center frequency to the fourteenth sub-band using 10,296 MHz as a center frequency An I/Q digital baseband modulation transmission signal supplied from a not-shown baseband processor via a digital interface is converted to I/Q analog baseband modulation transmission signals Mod-I and Mod-Q by a D/A converter. The I/Q analog baseband modulation transmission signals Mod-I and Mod-Q are amplified by programmable gain amplifiers 401a and 401b. From output signals of the programmable gain amplifiers 401a and 401b, noise and unwanted waves in the D/A converter are eliminated by low-pass filters 402a and 402b.

The I/Q analog baseband modulation transmission signals as outputs of the low-pass filters 402a and 402b are input to a direct up-conversion modulator 403 and converted to RF transmission signals. The direct up-conversion modulator 403 is comprised of two modulators MOD(I) and MOD(Q) to which the I/Q analog baseband modulation transmission signal and the transmission local signal from the local signal generator 311 are supplied and an analog adder for vector synthesis. As the two modulators MOD(I) and MOD(Q) and the analog adder for vector synthesis in FIG. 23, two double-balanced mixers 10 having the full-differential parallel resonant circuit 22 as a common active load can be used.

An RF transmission signal from the direct up-conversion modulator 403 is amplified by a programmable gain amplifier 404 and thereafter, amplified by an RF power amplifier 405. After that, the amplified signal is transmitted from an antenna.

In the up-conversion transmitter shown in FIG. 23, a transmission local signal generated by the local signal generator 311 is supplied to the direct up-conversion modulator 403. As a voltage controlled oscillator of the frequency synthesizer of the local signal generator 311 for generating the transmission local signal, a voltage controlled oscillator having the parallel resonant circuit 22 as an active load shown in FIG. 18 can be used. Further, as the local signal generator 311 in FIG. 23, a frequency synthesizer similar to the frequency synthesizer 311 shown in FIG. 21 can be also used.

Chip Layout of Parallel Resonant Circuit

Figure 24:
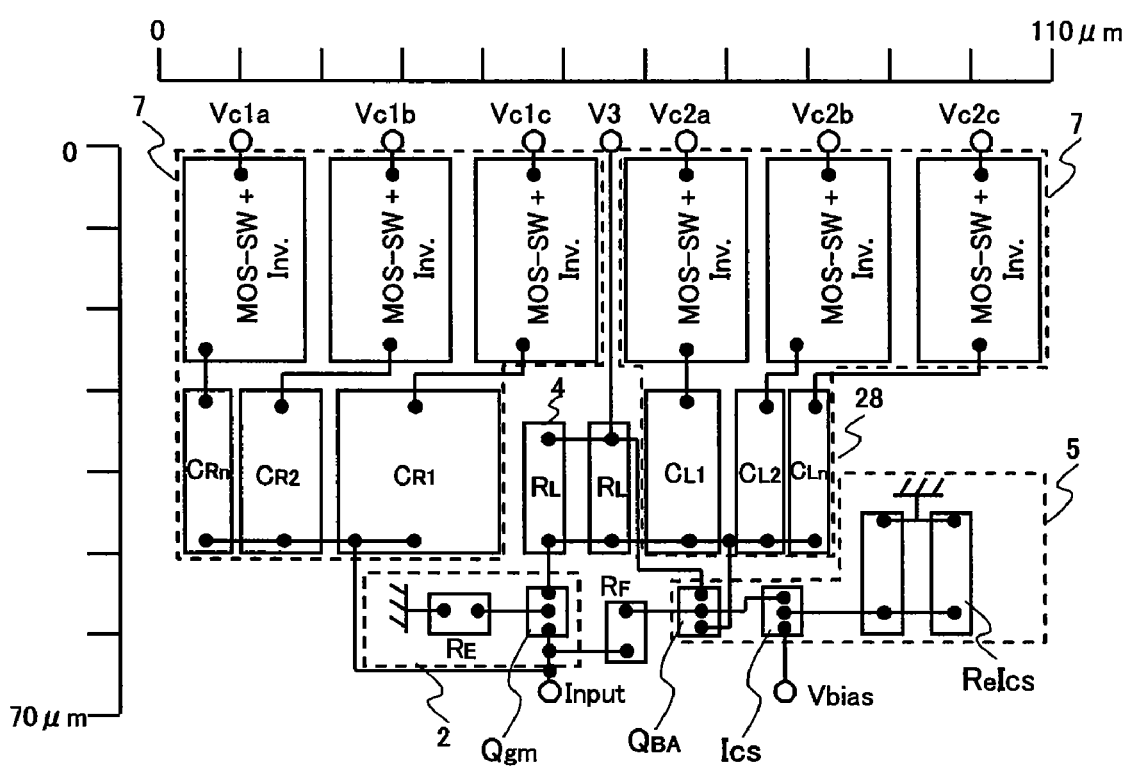
FIG. 24 is a diagram showing a chip layout for forming the parallel resonant circuit 25 illustrated in FIG. 9.

FIG. 24 is a diagram showing a chip layout for forming the parallel resonant circuit 25 shown in FIG. 9 on a semiconductor chip. The parallel resonant circuit 25 in FIG. 9 has a rectangular chip occupation area of about 110 μm×about 70 μm as shown in FIG. 24. In a lower part of the rectangular shape, the transconductance circuit 2 including, from the right, an emitter resistor $R_E$ and an NPN-type bipolar transistor Qgm is disposed. On the right side of the circuit 2, a feedback resistor $R_F$ is disposed. On the right side of the feedback resistor $R_F$, the buffer circuit 5 including an NPN-type bipolar transistor $Q_{BA}$, a constant current source transistor Ics, and an emitter resistor ReIcs is disposed. On the left side with respect to the center of FIG. 24 and the left upper part, a variable capacitor 7 including three MIM (Metal-Insulator-Metal) capacitors $C_{R1}$, $C_{R2}$, and $C_{R3}$ forming the variable capacitor 3 and three on/off-control MOS switches connected to the three MIM capacitors is disposed. On the right side with respect to the center of FIG. 24 and the right upper part, another variable capacitor 7 including three MIM capacitors $C_{L1}$, $C_{L2}$, and $C_{L3}$ forming the variable capacitor 1 and three on/off-control MOS switches connected to the three MIM capacitors is disposed. Between the left variable capacitor 7 and the other right variable capacitor 7, two parallel resistors 4 each having a resistance value capacitor $R_L$ are disposed.

In such a manner, as illustrated in FIG. 24, the parallel resonant circuit 25 shown in FIG. 9 having a rectangular chip occupation area of about 110 μm×about 70 μm. It can be understood that the parallel resonant circuit 25 of FIG. 24 realizes the chip occupation area much smaller than the spiral inductor having the chip occupation area of 150 μm×150 μm as described in the non-patent document 1.

The present invention achieved by the inventors herein has been concretely described on the basis of the embodiments. However, the invention is not obviously limited by the embodiments but can be variously modified.

For example, the present invention can be used for UWB wireless communication employing the MB-OFDM system using frequencies from the first sub-band having the bandwidth of 528 MHz using 3,432 MHz as a center frequency to the fourteenth sub-band similarly having the bandwidth of 528 MHz using 10,296 MHz as a center frequency, and also can be used for a dual-band wireless LAN of about 2.4 GHz and about 5 GHz.

Obviously, the amplifier used for the invention is not limited to a bipolar transistor and a MOS transistor. Also in the case where the amplifier is used for a heterojunction bipolar transistor, a high electron mobility transistor, a metal semiconductor junction field effect transistor, or the like, similar effects can be obtained.

Further, the series connection between the capacitor 1 using the gyrator shown in FIG. 7 and the equivalent inductor L can be used as a high-pass filter HPF capable of changing the cutoff frequency. By changing the connection order of the capacitor 1 and the equivalent inductor L in the series connection, the series connection can be also used as a low-pass filter LPF capable of changing the cutoff frequency.

What is claimed is:

1. A semiconductor integrated circuit comprising:

over a semiconductor chip, a resonant circuit including a first capacitor having a variable capacitance controlled by a first control signal applied to a first control terminal, and a gyrator for equivalently emulating an inductor by including a second capacitor having a variable capacitance controlled by a second control signal applied to a second control terminal, wherein the first capacitor has a first terminal, a second terminal, and a third terminal, the third terminal of the first capacitor is coupled to the first control terminal, the variable capacitance between the first terminal and the second terminal of the first capacitor is controlled by the first control signal applied to the third terminal of the first capacitor, wherein the second capacitor has a first terminal, a second terminal, and a third terminal, the third terminal of the second capacitor is coupled to the second control terminal, the variable capacitance between the first terminal and the second terminal of the second capacitor is controlled by the second control signal applied to the third terminal of the second capacitor.

2. The semiconductor integrated circuit according to claim 1, wherein, by equivalently connecting the first capacitor and the inductor in parallel, the resonant circuit forms a parallel-resonant circuit, and wherein, by controlling at least one of the variable capacitance of the first capacitor and the variable capacitance of the second capacitor, a parallel resonant frequency of the parallel-resonant circuit is set to a desired frequency.

3. The semiconductor integrated circuit according to claim 2, wherein at a time of changing the parallel resonant frequency of parallel-resonant circuit to the desired frequency, the variable capacitance of the first capacitor and the variable capacitance of the second capacitor are cooperatively changed using the first and second control signals.

4. The semiconductor integrated circuit according to claim 3, wherein the parallel-resonant circuit is an active load connected to an output node of an amplifier.

5. The semiconductor integrated circuit according to claim 4, wherein the amplifier is at least a component which composes one of a low noise amplifier, a voltage controlled oscillator, and a mixer.

6. The semiconductor integrated circuit according to claim 4, wherein the amplifier processes a signal in two or more frequency bands selected from a frequency range from about 2 GHz to about 14 GHz.

7. The semiconductor integrated circuit according to claim 2, wherein the gyrator comprises:

a first transconductance circuit for generating current to be supplied to the variable capacitance of the second capacitor in response to voltage of the variable capacitance of the first capacitor at its input terminal; and a second transconductance circuit for feeding back current responding to the voltage of the variable capacitance of the second capacitor to the input terminal of the first transconductance circuit.

8. The semiconductor integrated circuit according to claim 7, wherein the first transconductance circuit includes either a common-emitter bipolar transistor whose emitter is connected to an AC ground potential node via a resistor or a common-source field effect transistor whose source is connected to an AC ground potential node via a resistor.

9. The semiconductor integrated circuit according to claim 7, wherein the second transconductance circuit includes a buffer circuit and a feedback resistor.

10. The semiconductor integrated circuit according to claim 2, wherein the first and second control signals are digital or analog signals.

11. The semiconductor integrated circuit according to claim 10, wherein the digital signal is a band selection signal of a plurality of bits for selecting any of a plurality of radio frequency bands for wireless communication.

12. A semiconductor integrated circuit comprising:
over a semiconductor chip, an amplifier and an active load connected to an output node of the amplifier,
wherein the active load comprises
a first capacitor having a variable capacitance controlled by a first control signal applied to a first control terminal; and
a gyrator for equivalently emulating an inductor by including a second capacitor having a variable capacitance controlled by a second control signal applied to a second control terminal,
wherein the first capacitor has a first terminal, a second terminal, and a third terminal, the third terminal of the first capacitor is coupled to the first control terminal, the variable capacitance between the first terminal and the second terminal of the first capacitor is controlled by the first control signal applied to the third terminal of the first capacitor,
wherein the second capacitor has a first terminal, a second terminal, and a third terminal, the third terminal of the second capacitor is coupled to the second control terminal, the variable capacitance between the first terminal and the second terminal of the second capacitor is controlled by the second control signal applied to the third terminal of the second capacitor, and
wherein the first capacitor and the inductor are equivalently connected in parallel in the active load.

13. The semiconductor integrated circuit according to claim 12, wherein by controlling at least one of the variable capacitance of the first capacitor and the variable capacitance of the second capacitor, a parallel resonant frequency of the active load is set to a desired frequency.

14. The semiconductor integrated circuit according to claim 13,
wherein at a time of changing the parallel resonant frequency of the active load to the desired frequency, the variable capacitance of the first capacitor and the variable capacitance of the second capacitor are cooperatively changed using the first and second control signals.

15. The semiconductor integrated circuit according to claim 14, wherein the amplifier processes a signal in two or more frequency bands selected from a frequency range from about 2 GHz to about 14 GHz.

* * * * *